(12) United States Patent
Izumi et al.

(10) Patent No.: US 6,781,109 B2
(45) Date of Patent: Aug. 24, 2004

(54) ACTIVE MATRIX SUBSTRATE HAVING TRANSPARENT CONNECTING TERMINALS

(75) Inventors: Yoshihiro Izumi, Kashihara (JP); Osamu Teranuma, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/265,408

(22) Filed: Oct. 7, 2002

(65) Prior Publication Data

US 2003/0102424 A1 Jun. 5, 2003

Related U.S. Application Data

(63) Continuation of application No. 09/477,338, filed on Jan. 4, 2000, now Pat. No. 6,518,557.

(30) Foreign Application Priority Data

Jan. 14, 1999 (JP) ............................................. 11-8423
Dec. 15, 1999 (JP) ......................................... 11-355910

(51) Int. Cl.$^7$ ............................................. H01L 31/00
(52) U.S. Cl. ................................................. 250/214.1
(58) Field of Search ........................... 250/208.1, 214.1; 257/443; 349/44, 111

(56) References Cited

U.S. PATENT DOCUMENTS

| | | | | |
|---|---|---|---|---|
| 5,311,341 A | 5/1994 | Hirai | ........................... | 349/150 |
| 5,467,210 A | 11/1995 | Kishigami | .................... | 349/150 |
| 5,847,781 A | * 12/1998 | Ono et al. | ..................... | 349/44 |

FOREIGN PATENT DOCUMENTS

| JP | 04-317146 | 11/1992 |
|---|---|---|
| JP | 04-362925 | 12/1992 |
| JP | 5-41091 U | 6/1993 |
| JP | 6-342098 A | 12/1994 |
| JP | 07-302973 | 11/1995 |
| JP | 10-213664 | 8/1998 |

OTHER PUBLICATIONS

Lee et a, "A New Digital Detector for Projection Radiography", SPIE, vol. 2432, Jul. 1995, pp. 237–249.

Jeromin et al, "8.4: Application of a-Si Active-Matrix Technology in a X-Ray Detector Panel", SID 97 Digest, 1997, pp. 91–94.

Japanese Office Action dated May 6, 2003 (along with English Translation thereof).

* cited by examiner

Primary Examiner—Thanh X. Luu
(74) Attorney, Agent, or Firm—Nixon & Vanderhye P.C.

(57) ABSTRACT

An active-matrix substrate is provided with electrode wires disposed in a lattice form, a plurality of switching elements disposed respectively at intersections of the electrode wires, and connecting terminals for connecting the electrode wires to the outside, the electrode wires include metal electrodes, and at least parts of the connecting terminals have a property of transmitting light. A two-dimensional image detector includes the active-matrix substrate and the amorphous semiconductor layer, which is formed on the active-matrix substrate and has electromagnetic wave conductivity. The connecting terminals are connected with the outside via an anisotropic conductive adhesive having photo-reactivity. A display device includes the active-matrix substrate and an opposing substrate which is disposed so as to oppose the active-matrix substrate via an electro-optical medium, and the connecting terminals are connected to the outside via an anisotropic conductive adhesive having photo-reactivity.

6 Claims, 15 Drawing Sheets

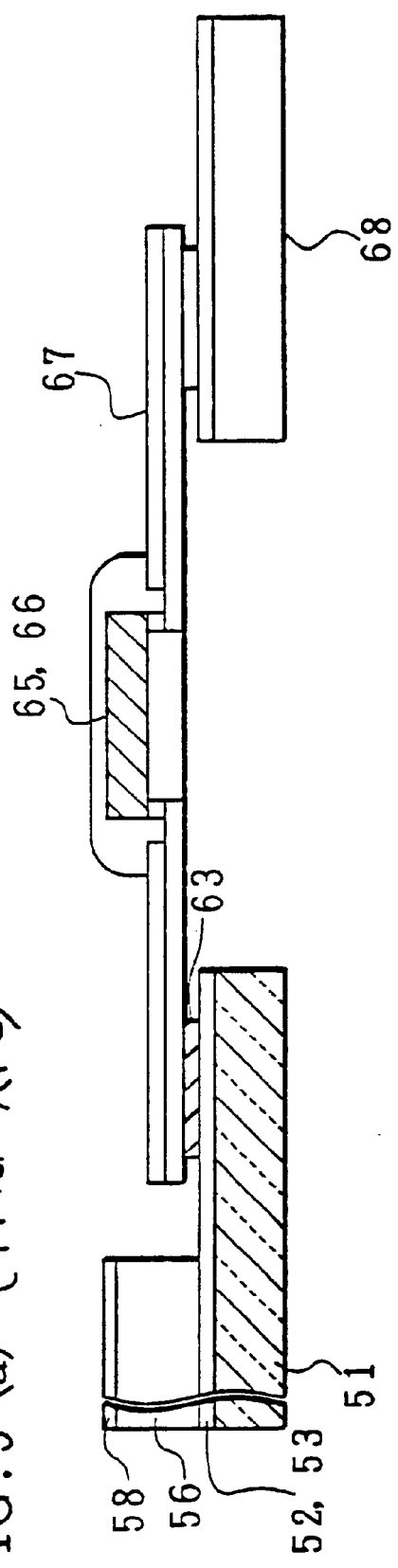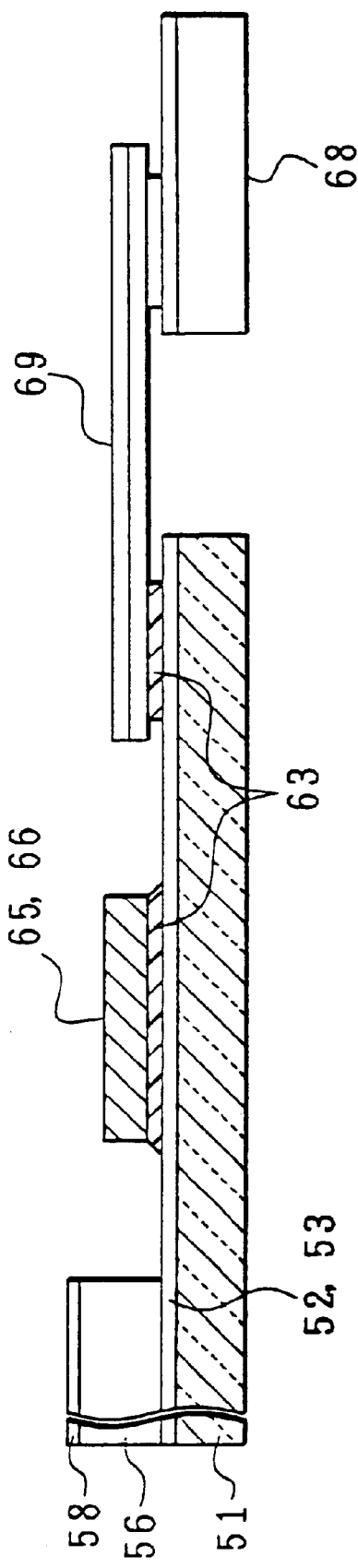
FIG. 9 (a) (Prior Art)
FIG. 9 (b) (Prior Art)

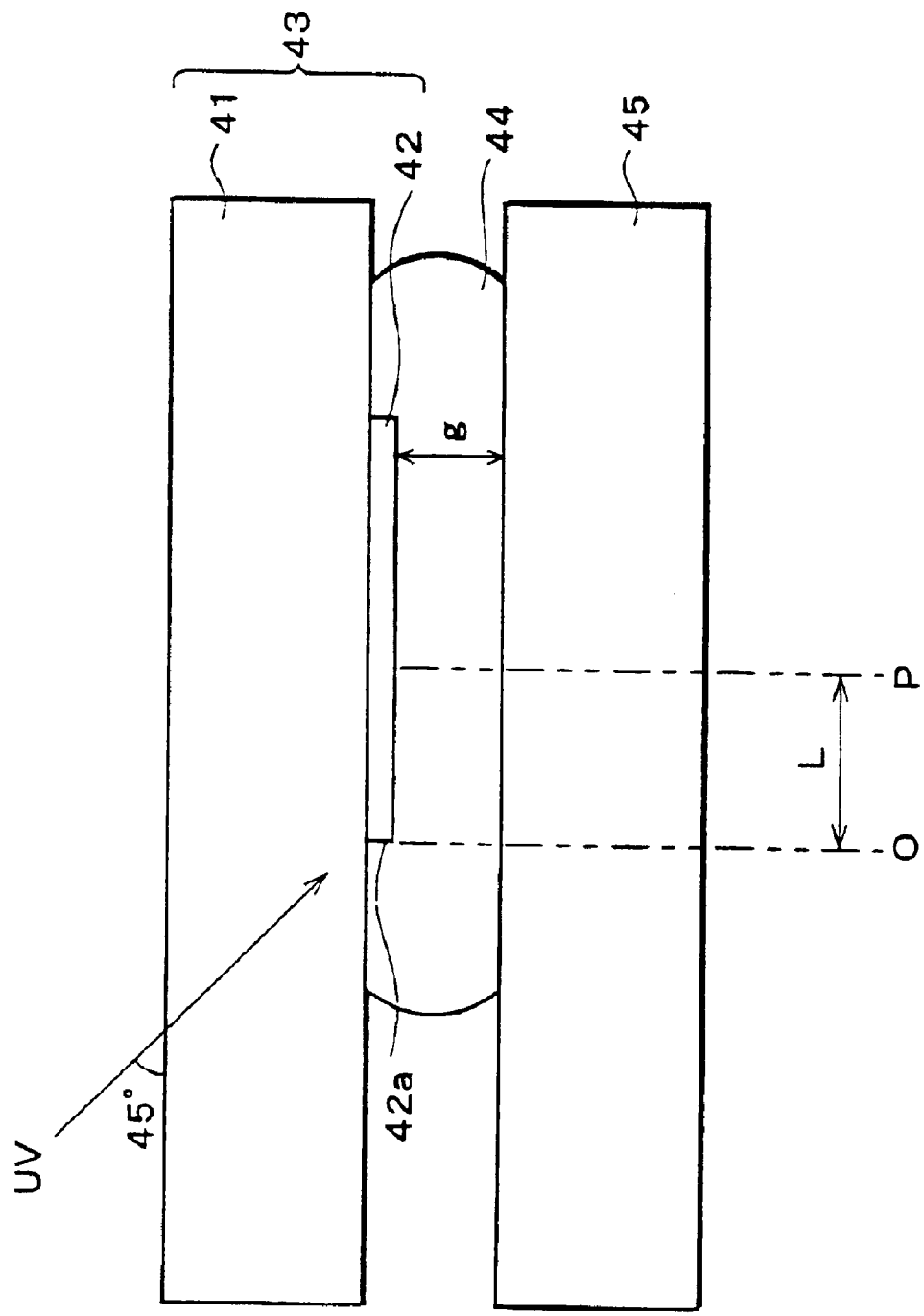

ACTIVE MATRIX SUBSTRATE HAVING TRANSPARENT CONNECTING TERMINALS

This application is a continuation of application Ser. No. 09/477,338, filed Jan. 4, 2000, now U.S. Pat. No. 6,518,557 the entire content of which is hereby incorporated by reference in this application.

FIELD OF THE INVENTION

The present invention relates to a two-dimensional image detector, which includes connecting terminals (input/output terminals, mainly input terminals in a display device) for connecting electrode wires of an active-matrix substrate to the outside, and which is connected to the outside via an anisotropic conductive adhesive, and further concerns an active-matrix substrate and a display device. To be specific, the present invention relates to an active-matrix substrate which can be readily connected to the outside at a low temperature and maintain a resistance value at a fixed value, a two-dimensional image detector using the same, and a display device.

BACKGROUND OF THE INVENTION

Conventionally, a two-dimensional image detector for radiation has been known with the following construction: semiconductor sensors, each being provided with a semiconductor layer, a pixel electrode, and others for detecting an X-ray and generating electric charge (electron-hole pair, namely, with photoconductivity), are two-dimensionally disposed in a matrix form (in column and row directions), each of the pixel electrodes is provided with a switching element, and the electrical switches are successively turned on for each raw and the electric charge is read for each column.

A specific structure and principle of such a two-dimensional image detector are described in "D. L. Lee, et al., 'A New Digital Detector for Projection Radiography', SPIE, 2432, pp. 237–249, 1995" (published in 1995), "L. S. Jeromin, et al., 'Application of a-Si Active-Matrix Technology in a X-ray Detector Panel', SID 97 DIGEST, pp. 91–94, 1997" (first edition is published in May, 1997), and Japanese Laid-Open Patent Publication No. 342098/1994 (Tokukaihei 6-342098, published on Dec. 13, 1994).

The following explanation describes the structure and principle of a typical two-dimensional image detector for radiation.

FIG. 6 is a schematic diagram showing the construction of the two-dimensional image detector for radiation. Further, FIG. 7 is a schematic diagram showing a sectional structure for one pixel of the two-dimensional image detector for radiation.

As shown in FIGS. 6 and 8, the two-dimensional image detector for radiation is provided with an active-matrix substrate 51 having electrode wires (gate electrode group 52 consisting of a plurality of gate electrodes G1, G2, G3, . . . , and Gn and source electrode group 53 consisting of a plurality of source electrodes S1, S2, S3, . . . , and Sn) in an XY matrix form, a TFT (thin film transistor) 54 and a storage capacitor (Cs) 55, on a glass substrate. Moreover, input/output terminals are disposed on ends (not shown) of the active-matrix substrate 51. Furthermore, a photoconductive film 56, a dielectric layer 57, and an upper electrode 58 are formed on virtually the entire surface of the active-matrix substrate 51.

The storage capacitor 55 has a construction in which a Cs electrode 59 is opposed via an insulating film 61 to a pixel electrode 60 connected with a drain electrode of the thin-film transistor 54.

For the photoconductive film 56 (amorphous semiconductor layer), a semiconductive material is used to generate electric charge (electron-hole pair) by exposure to radiation such as an X-ray. According to the aforementioned literatures, amorphous selenium (a-Se) is used as a semiconductor material, which has high dark resistance and favorable photoconductivity and can form a large film by evaporation. The photoconductive film (a-Se) 56 is formed with a thickness of 300–600 μm by using a vacuum evaporation method.

Further, an active-matrix substrate, which is formed in a manufacturing process of a liquid crystal display device, can be applied to the aforementioned active-matrix substrate 51. For example, the active-matrix substrate used for an active matrix liquid crystal display device (AMLCD: Active Matrix LCD) is provided with the TFT made of amorphous silicon (a-Si) or polysilicon (p-Si), an XY matrix electrode, and a storage capacitor. Therefore, only if a few changes are made in arrangement, the active-matrix substrate can be used for the two-dimensional image detector for radiation.

The following explanation describes a principle of operations of the two-dimensional image detector for radiation having the above-mentioned structure.

Electric charge (electron-hole pair) is generated in the photoconductive film 56 when the photoconductive film 56 such as an a-Se film is exposed to radiation. As shown FIGS. 6 through 8, the photoconductive film 56 and the storage capacitors (Cs) 55 are electrically connected in series with each other; thus, when voltage is applied between the upper electrode 58 and the Cs electrode 59, electric charge (electron-hole pair) generated in the photoconductive film 56 moves to a positive electrode side and a negative electrode side. As a result, the storage capacitors (Cs) 55 stores electric charge. Further, an electron blocking layer 62 made of a thin insulating layer is formed between the photoconductive film 56 and the storage capacitor (Cs) 55. The electron blocking layer 62 acts as a blocking photodiode for preventing electric charge from being injected from one side.

With the above-mentioned effect, the thin-film transistor (TFT) 54 is turned on in response to input signals of gate electrodes G1, G2, G3, . . . , and Gn so that the electric charge stored in the storage capacitors (Cs) 55 can be applied to the outside from source electrodes S1, S2, S3, . . . , and Sn. The gate electrode group 52 and the source electrode group 53, the TFT 54, the storage capacitors 55, and the like are made in a matrix form; therefore, it is possible to obtain two-dimensional image information of an X-ray by on lines sequentially scanning signals inputted to gate electrodes G1, G2, G3, . . . , and Gn.

Additionally, in the case when the used photoconductive film has photoconductivity for a visible ray and an infrared ray as well as for the radiation such as an X-ray, the above-mentioned two-dimensional image detector for radiation acts as a two-dimensional image detector for detecting the visible ray and the infrared ray. For example, the a-Se film has favorable photoconductivity to a visible ray, and an image sensor with a high sensitivity has been developed by using an avalanche effect of applying a high electric field.

Incidentally, the two-dimensional image detector for radiation is provided (packaged) with a "driving circuit" (driving IC) for applying a driving voltage for the switching element (TFT) to the gate electrode group 52 and the source electrode group 53 on ends of the active-matrix substrate 51, and a "reading circuit" (reading IC) for reading information on an image. Upon mounting (packaging) these circuits, TCP (Tape Carrier Package) method and COG (Chip on Glass) method are mainly used.

FIG. 9(a) shows an example of an arrangement of package in accordance with TCP method. In TCP method, a wire pattern is formed by copper foil and the like on a TCP substrate 67 having a base film made of a material such as polyimide, and electric members including a driving IC 65 and a reading IC 66 are mounted thereon. One end of the TCP substrate 67 is connected to input/output terminals (not shown) disposed on ends of the active-matrix substrate 51, and the other end is connected to an external circuit substrate (PWB: Printed Wiring Board) 68.

Further, FIG. 9(b) shows an example of an arrangement in accordance with COG method. In this method, the driving IC 65 and the reading ID 66 are directly mounted and connected onto the active-matrix substrate 51 (namely, glass substrate) of the two-dimensional image detector for radiation. Additionally, power and a signal is inputted and outputted to the driving IC and the reading IC 66 by using an FPC (Flexible Printed Circuit) substrate 69. Moreover, as an application of COG method, it is possible to form the driving IC 65 and the reading IC 66 in a monolithic manner upon manufacturing the active-matrix substrate 51.

In the above mounting methods, as for connection between the TCP substrate 67 and the active-matrix substrate 51 (TCP connection), connection between the active-matrix substrate 51 and the driving IC 65 or the reading IC 66 (COG connection), connection between the FPC substrate 69 and the active-matrix substrate 51 (FPC connection), and other connections, a bonding part 63 made of an anisotropic conductive adhesive is usually provided.

The anisotropic conductive adhesive used as the bonding part 63 is obtained by evenly dispersing conductive particles into a resin (binder) having adhesion. A film-type and a past-type adhesives are available. An special adhesive is also available, in which conductive materials are formed into columns in a bonding film. A thermosetting resin and a thermoplastic resin are generally adopted as the binder used for the anisotropic conductive adhesive. Table 1 shows connecting conditions of representative anisotropic conductive adhesives.

TCP method and COG method, heat applied from the outside to cure the anisotropic conductive adhesive is conducted via the active-matrix substrate 51 to the a-Se film (photoconductive film 56) formed on the active-matrix substrate 51, particularly to a part of the a-Se film that is located around an image pick-up area. Specifically, when heat is conducted to the a-Se film, the following problem occurs.

Generally, the a-Se film is formed by evaporation at 60–80° C. or more so as to be amorphous with high dark resistance of about $10^{12}$ Ωcm; thus, the a-Se film has proper characteristics for the two-dimensional image detector. However, when a heating operation is performed after the film is formed, the dark resistance decreases to a maximum of about $10^5$ Ωcm. This is because the crystallization of the amorphous a-Se film is developed by heat. Moreover, it has been known that the crystallization of the a-Se film is developed at a relatively low temperature of 60–80° C. as well as at a high temperature.

Generally, in the two-dimensional image detector for radiation, the a-Se film is used as the photoconductive film. One of the reasons is that it is possible to obtain an image signal with excellent sensitivity to an X-ray (S/N ratio: signal to noise ratio) because of its high dark resistance. Therefore, dark resistance reduced by heat is a critical problem to the two-dimensional image detector for radiation.

In order to avoid such a problem, a method is available, in which the driving IC and the reading IC are mounted on the active-matrix substrate by using TCP method and COG method, and the a-Se film is formed at room temperature.

However, it is necessary to provide a process of putting the active-matrix substrate, on which the driving IC and the reading IC are mounted, into a vacuum chamber, and the a-Se film is evaporated. Thus, during the process, a possibility of damage increases on the driving IC and the reading IC. Further, when the a-Se film is formed by an automatic mass-producing apparatus, a special system for transporting a substrate is necessary to prevent damage on the driving IC and the reading IC.

Moreover, as the active-matrix substrate, it is possible to adopt an active-matrix substrate formed in the process of manufacturing a liquid crystal display device. The active-matrix substrate having the above construction can be effec-

TABLE 1

| ANISOTROPIC CONDUCTIVE ADHESIVE | KIND OF BINDER | BONDING TEMPERATURE (° C.) | TIME (SECOND) |
| --- | --- | --- | --- |
| ANISOTROPIC CONDUCTIVE FILM Hitachi Chemical Co., Ltd. Anisolum AC-7073 | THERMOSETTING RESIN | 170 ± 10 | 20 |
| ANISOTROPIC CONDUCTIVE FILM SONY CHEMICALS CORP. CP87201H | THERMOSETTING RESIN | 220 ± 10 | 5≦ |

According to Table 1, when a conventional thermosetting resin and thermoplastic resin are used for the anisotropic conductive adhesive, a heating operation of (150° C. or more)×(5–30 seconds) is normally necessary in order to obtain adhesion and conductivity by using a thermosetting reaction or a thermoplastic operation of the above resins while pressurizing.

However, regarding the two-dimensional image detector using the conventional thermosetting resin and thermoplastic resin, when the driving IC 65 and the reading IC 66 are packaged on ends of the active-matrix substrate 51 by using tively used as an active-matrix substrate of the liquid crystal display device and the like as well as the above two-dimensional image detector. In recent years, there has been a growing need for a larger model, high definition, and lower cost regarding a display device using the active-matrix substrate. Particularly, in order to realize high definition, upon connecting the connecting terminals (input/output terminals, mainly input terminals in a display device) to the outside so as to connect the active-matrix substrate and the outside, high connecting accuracy is required.

SUMMARY OF THE INVENTION

The objective of the present invention is to provide an active-matrix substrate, which can readily make a connection with the outside at a low temperature and maintain a resistance value at a fixed value, and to provide a two-dimensional image detector and a display device, that use the active-matrix substrate. Especially, the objective of the present invention is to provide the two-dimensional image detector which can prevent degradation in a characteristic of an amorphous semiconductor layer, that is caused by heating upon making a connection with the outside, and can maintain sensitivity to detect an image. Further, the objective of the present invention is particularly to provide the display device with high definition.

The inventor et al. has continued their studies in earnest in order to overcome the aforementioned problems. As a result, they have completed the present invention with the following findings: an anisotropic conductive adhesive, which is used for connecting the two-dimensional image detector and an external device or connecting the display device and the external device, has a photo-curing property so as to lower a heating temperature upon making a connection; electrodes including metal electrodes are used as electrode wires on an active-matrix substrate, which serves as a substrate part of the two-dimensional image detector, and at least parts of connecting terminals, which serve as bonding parts for electrically connecting the electrodes and the outside, have the property of transmitting light, so that it is possible to readily use the anisotropic conductive adhesive, which has photo-reactivity and can be connected at a low temperature, as an adhesive connecting the connecting terminals with the outside, and it is possible to prevent degradation in a characteristic of the amorphous semiconductor layer while maintaining a resistance value within a fixed range; consequently, sensitivity to detect an image can be maintained. Moreover, the inventor et al. reached the following findings: the active-matrix substrate is used for the display device, so that it is possible to readily use the anisotropic conductive adhesive, which has photo-reactivity and can be connected at a low temperature, as an adhesive for connecting the external terminals to the outside, and it is possible to prevent degradation in positioning accuracy, that is caused by thermal expansion of the substrates and the connecting members and to maintain a resistance value within a fixed range; consequently, it is possible to provide the display device with high definition.

In the present invention, the anisotropic conductive adhesive, has photo-reactivity (the photoreactive anisotropic conductive adhesive) includes an adhesive (photo-curing adhesive) in which a curing reaction is developed by irradiation of light such as an ultraviolet ray and a visible ray, and an adhesive (photo-assist thermosetting adhesive) in which activation is improved by irradiation of light such as an ultraviolet ray and a visible ray and a curing reaction is developed by a heating operation at a relatively low temperature.

In order to achieve the above objective, the two-dimensional image detector of the present invention is characterized by including (a) the active-matrix substrate which is provided with the electrode wires disposed in a lattice form, a plurality of switching elements disposed respectively at intersections of the electrode wires, and the connecting terminals for connecting the electrode wires to the outside, and (b) the amorphous semiconductor layer formed with electromagnetic wave conductivity on the active-matrix substrate, wherein the electrode wires include metal electrodes, at least parts of the connecting terminals have the property of transmitting light and are connected to the outside via the anisotropic conductive adhesive having photo-reactivity.

Further, in order to achieve the aforementioned objective, the two-dimensional image detector of the present invention is characterized by including the electrode wires disposed in a lattice form; a plurality of the switching elements disposed respectively at the intersections of the electrode wires; the amorphous semiconductor layer having electromagnetic wave conductivity; an image detecting section for detecting an electromagnetic wave image, which is emitted into the amorphous semiconductor layer, in response to a control signal inputted to the electrode wires; the connecting terminals which are connected with the outside as input/output terminals, input a control signal into the electrode wires so as to detect the electromagnetic wave image emitted into the amorphous semiconductor layer, and output an image signal according to the electromagnetic wave image; and the bonding part for electrically connecting the connecting terminals to the outside, wherein the electrode wires include metal electrodes, at least parts of the connecting terminals have the property of transmitting light, and the bonding part is made of the anisotropic conductive adhesive having photo-reactivity.

According to the above arrangement, the electrode wires include the metal electrodes, so that it is possible to maintain a resistance value within a fixed range. Additionally, with this arrangement, at least parts of the connecting terminals, which connect the electrode wires on the bonding part to the outside, have the property of transmitting light, so that it is possible to readily use the anisotropic conductive adhesive having photo-reactivity upon making a connection to the outside. Further, upon making a connection with the outside, the anisotropic conductive adhesive having photo-reactivity is used so as to lower a heating temperature of the connection. Therefore, a heating operation at a high temperature is not necessary when the bonding part is connected to the outside; thus, it is possible to prevent crystallization from developing in the amorphous semiconductor layer during the heating operation. Hence, this arrangement makes it possible to prevent degradation in a characteristic such as high dark resistance of the amorphous semiconductor layer. Therefore, according to the above arrangement, it is possible to favorably maintain sensitivity to detect an image.

Furthermore, in order to achieve the aforementioned objective, the active-matrix substrate of the present invention is characterized by including the electrode wires disposed in a lattice form, a plurality of the switching elements disposed respectively at the intersections of the electrode wires, and the connecting terminals for connecting the electrode wires to the outside, wherein the electrode wires include the metal electrodes, and at least parts of the connecting terminals have the property of transmitting light.

According to this arrangement, the electrode wires include the metal electrodes so as to maintain a resistance value within a fixed range. Additionally, with this arrangement, at least parts of the connecting terminals have the property of transmitting light, so that when the connecting terminals are connected to the outside, for example, to an external member such as an electric circuit by using the anisotropic conductive adhesive which has photo-reactivity, in TCO method or COG method, it is possible to readily use the anisotropic conductive adhesive which has photo-reactivity as an adhesive for connecting the connecting terminals to the outside, and a connection to the outside can be readily made at a low temperature.

Thus, the above active-matrix substrate is suitable for the two-dimensional image detector and the display device. The active-matrix substrate is used for the substrate parts of the two-dimensional image detector and the display device, so that it is possible to prevent degradation in a characteristic of the amorphous semiconductor layer and degradation in positioning accuracy, that is caused by thermal expansion of the substrates and the connecting members, while maintaining a resistance value at a fixed value. Consequently, the active-matrix substrate is used so as to favorably maintain sensitivity to detect an image of the two-dimensional image detector, and higher definition can be realized in the display device.

Further, in order to achieve the aforementioned objective, the display device of the present invention is characterized by including (a) the active-matrix substrate which is provided with the electrode wires disposed in a lattice form, a plurality of the switching elements disposed respectively at the intersections of the electrode wires, and the connecting terminals for connecting the electrode wires to the outside, and (b) an opposing substrate which is disposed so as to oppose the active-matrix substrate via an electro-optical medium, wherein the electrode wires include the metal electrodes, and at least parts of the connecting terminals have the property of transmitting light and are connected to the outside via the anisotropic conductive adhesive having photo-reactivity.

According to this arrangement, the electrode wires include the metal wires so as to maintain a resistance value within a fixed range. Additionally, with this arrangement, at least parts of the connecting terminals, which connect the electrode wires on the bonding part to the outside, have the property of transmitting light, so that it is possible to readily use the anisotropic conductive adhesive which has photo-reactivity upon making a connection to the outside. Further, upon making a connection to the outside, the anisotropic conductive adhesive which has photo-reactivity is used so as to lower a heating temperature of the connection. Therefore, a heating operation at a high temperature is not necessary when the bonding part is connected to the outside; thus, a heating temperature can be lowered upon connecting the input/output terminals to the outside, and it is possible to prevent degradation in positioning accuracy, that is caused by thermal expansion of the substrates and the connecting members. Therefore, it is possible to improve connecting accuracy of the display device while maintaining a resistance value within a fixed range, so that higher definition can be realized in the display device.

For a fuller understanding of the nature and advantages of the invention, reference should be made to the ensuing detailed description taken in conjunction with the accompanying drawings.

BRIEF DESCRIPTION OF THE DRAWINGS

FIG. 9(a) is a sectional view showing an example of the arrangement of TCP method in a typical two-dimensional image detector.

FIG. 9(b) is a sectional view showing an example of the arrangement of COG method in a typical two-dimensional image detector.

FIG. 10 is a diagram for explaining a method for measuring a diffraction effect of an ultraviolet ray on connecting terminals.

DESCRIPTION OF THE EMBODIMENTS

Embodiment 1

Referring to figures, the following explanation describes the detail of one embodiment in accordance with the present invention.

Figure 1:
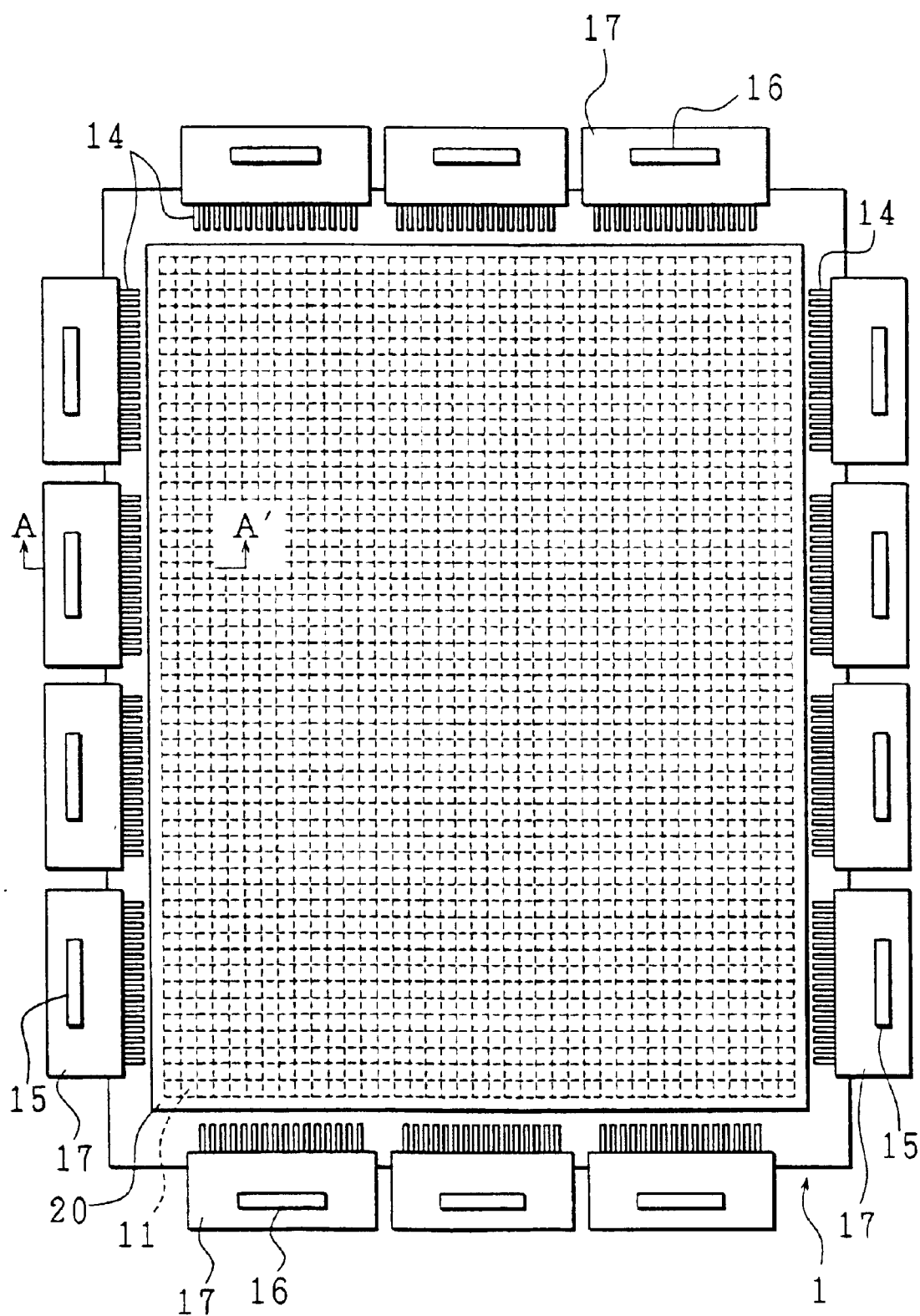
FIG. 1 is a plan view schematically showing the entire construction of a two-dimensional image detector in accordance with one embodiment of the present invention.
Figure 2:
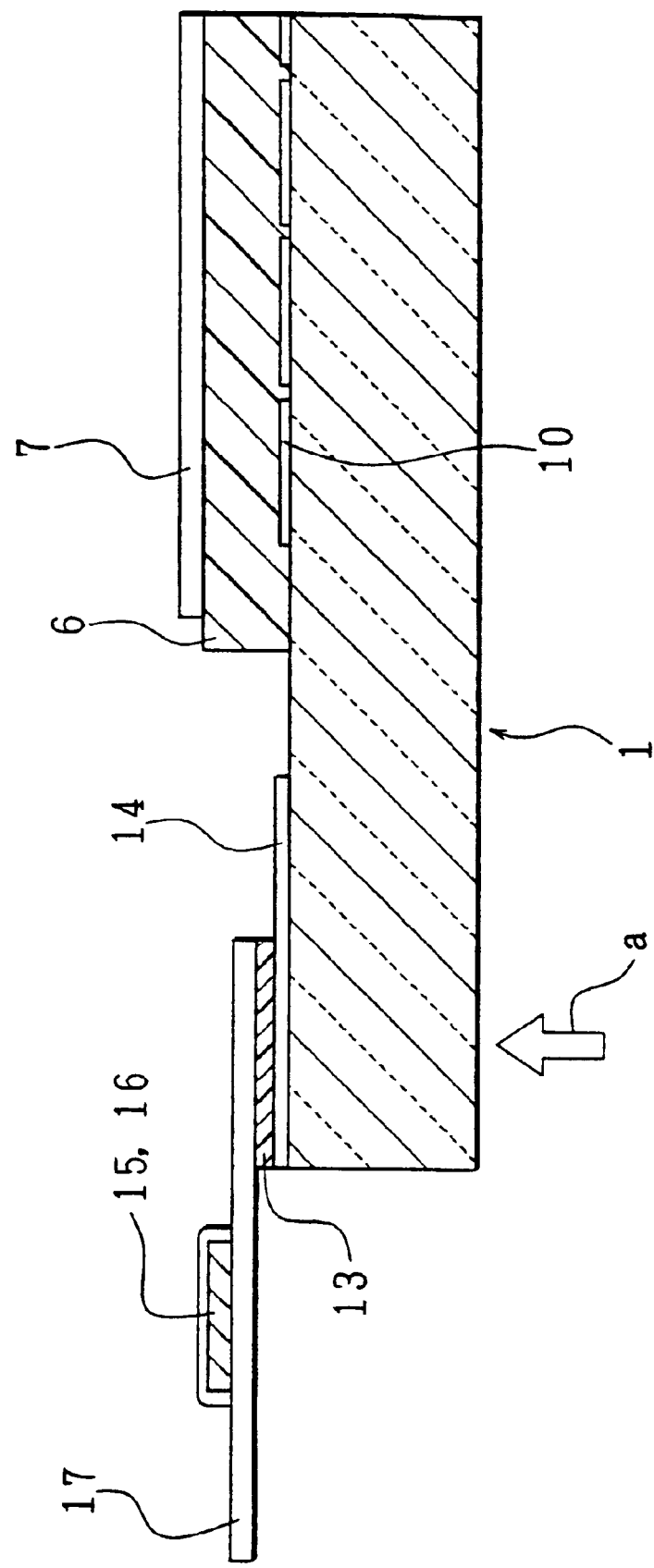
FIG. 2 is a sectional view taken along line A–A' shown in FIG. 1.

FIG. 1 is a plan view showing a two-dimensional image detector of the present embodiment. FIG. 2 is a sectional view taken along line A–A' shown in FIG. 1. As shown in FIG. 2, the two-dimensional image detector of the present embodiment has a construction in which pixel electrodes 10, an a-Se film 6 which is stacked on the pixel electrodes 10 and serves as an amorphous semiconductor layer having electromagnetic conductivity, and common electrodes 7 are disposed on an active-matrix substrate 1. Electromagnetic conductivity is, for example, a characteristic in which electric charge appears (electron-hole pair) upon emitting an electromagnetic wave such as an X-ray, an ultraviolet ray, an infrared ray, and a visible ray.

Here, the a-Se film 6 is an amorphous semiconductor layer, in which selenium is a main component with a ratio of 50 percents or more by weight. Additionally, as described above, the a-Se film 6 is crystallized in a heating operation at a relatively low temperature of 60–80° C., usually at 70° C. The crystallization is accelerated at the above temperature or more (60–80° C. or more).

As for the amorphous semiconductor layer having electromagnetic conductivity of the present embodiment, in addition to the a-Se film 6, it is possible to adopt a semiconductor material, in which an electromagnetic wave image of an X-ray, an ultraviolet ray, an infrared ray, and a visible ray is emitted (irradiated) so as to cause electric charge (electron-hole pair). As for the amorphous conductor layer, an a-Si film, an a-SiC film, and an a-SiGe film are available in addition to the a-Se film 6.

As shown in FIG. 1, an image detecting section of the two-dimensional image detector of the present embodiment is disposed on an area formed by a pixel alignment layer 11, the a-Se film 6, and the common electrodes 7, namely, on a placement area of the pixel alignment layer 11 which is covered with a placement area 20 of the a-Se film 6. The image detecting section detects an electromagnetic wave image, which is emitted to the amorphous semiconductor layer, as electric charge.

Additionally, the active-matrix substrate 1 can be formed in the same process as an active-matrix substrate formed in a process of a liquid crystal display device.

As shown in FIGS. 1 and 2, the two-dimensional image detector of the present embodiment is provided with the pixel alignment layer 11 having electrode wires (gate electrode and source electrode) formed in an XY-matrix form (lattice form), switching elements (TFT) disposed at each intersection, namely, for each pixel, a storage capacitor, a pixel electrode 10, and others, on the active-matrix substrate 1.

Moreover, on ends of the active-matrix substrate 1, a plurality of input/output terminals 14 are disposed to input a control signal for detecting an electromagnetic wave image emitted to the a-Se film 6, namely, the amorphous semiconductor layer and to output an image signal according to the electromagnetic wave image.

As shown in FIG. 1, driving ICs 15 and reading ICs 16 are connected (packaged (mounted)) onto the input/output terminals 14, which are formed on the active-matrix substrate 1, by using TCP method. The input/output terminals 14 are provided on ends of the active-matrix substrate 1 to input and output an electric signal to the gate electrodes and source electrodes disposed in an image pick-up area. Namely, the input/output terminals 14 are provided for inputting a control signal from an external electric circuit to the gate electrode. TFTs are turned on in response to the control signal so as to take out electric charge, which is accumulated in the storage capacitors, from the source electrodes to the outside as an image signal. Further, when outputting the image signal taken out to the outside, the input/output terminals 14 are used in the same manner. Here, for convenience of understanding, in FIG. 1, the connected TCP substrates 17 are fewer than an actual condition.

Furthermore, as described in the aforementioned literatures, the detail of the arrangement and the manufacturing method for the active-matrix substrate 1 have been well known and the arrangements are identical to those of FIGS. 6 through 9(a) and 9(b). Thus, the detailed explanation is omitted.

However, when such an active-matrix substrate is used for the two-dimensional image detector, it is desirable to increase a storage capacitor (Cs) disposed in each pixel so as to sufficiently maintain an obtained image signal. Hence, in the present embodiment, the storage capacitor (Cs) (for example, at 1 to 2 pF) is set larger than (for example, by 0.1 to 0.2 pF) that of an active-matrix substrate used in the conventional display device. Furthermore, in order to reduce a parasitic capacity of data bus line (source bus line and signal line) so as to improve an S/N ratio (signal to noise ratio), namely, to reduce noise, materials forming the electrode wire are changed, and a wire thickness and a layout of the wires are optimized.

Moreover, in FIG. 2, the arrangement of the TCP substrate 17 is identical to that of FIG. 9(a), in which a wiring pattern is formed by copper foil and the like on a base film made of a material such as polyimide, and the driving ICs and the reading ICs 16 are disposed (mounted) thereon.

As mentioned above, on the active-matrix substrate 1, the pixel alignment layer 11 is formed in which pixel electrodes 10 are arranged in a matrix form. On the pixel alignment layer 11, the a-Se film 6 and the common electrode 7 are disposed in this order so as to cover the pixel alignment layer 11.

The a-Se film 6 and the common electrode 7 are formed by using a vacuum evaporation method at room temperature. For example, the a-Se film 6 is formed with a thickness of about 500 μm to sufficiently absorb an X-ray. Here, in some cases, a buffer layer is located on the upper or lower surfaces of the a-Se film 6 to prevent injection a carrier from an electrode or to prevent crystallization of the a-Se film 6. Further, a metal film made of a material such as Au and Pt is formed with a thickness of 0.1 to 0.3 μm on the common electrode 7.

FIG. 2 shows an example of a package in which a bonding part 13 of the present embodiment is formed by using a typical TCP method. The TCP substrate 17 has a construction in which a wiring pattern is formed by copper foil on a substrate having a base film made of a material such as polyimide; and the driving IC 15, the reading IC 16, connecting terminals (input/output terminal) and others are mounted thereon. One end of the TCP substrate 17 is connected to the input/output terminals 14, which are disposed on an end of the active matrix substrate 1 constituting the two-dimensional image detector. The other end is connected to an external circuit substrate (PWB, not shown).

In the above mounting method, connection (TCP connection) between the TCP substrate 17 and the input/output terminals 14 disposed on the active-matrix substrate 1, namely, the bonding part 13, is formed by an anisotropic conductive adhesive. The anisotropic conductive adhesive connects the TCP substrate 17 and the input/output terminals 14 with adhesion and electrically connects the input/output terminals 14 to the outside with anisotropic conductivity.

Here, in the present embodiment, a photo-curing anisotropic conductive adhesive containing a photo-curing resin is adopted as the anisotropic conductive adhesive. Namely, the anisotropic conductive adhesive of the present embodiment is cured with light.

A photo-curing anisotropic conductive adhesive containing a photo-curing resin has a construction in which a photo-curing resin serves as a resin (binder) having adhesion and the conductive particles are evenly dispersed into the resin. For example, as the photo-curing anisotropic conductive adhesive, it is possible to adopt an anisotropic conductive adhesive containing an acrylic or epoxy photo-curing resin.

In the present embodiment, as an anisotropic conductive adhesive, a paste-type ultraviolet (UV) cure binder is used, in which resin particles plated with Au/Ni are dispersed. As the paste-type ultraviolet (UV) cure binder, it is possible to adopt, for example, TB3025 (manufactured by Three Bond Corp.) and the like. The advantage of a paste-type binder is to eliminate the need for a step of softening the anisotropic conductive adhesive in advance, because the anisotropic conductive adhesive can be subjected to a screen process printing with a fixed thickness. The diameter of the conductive particle is set such that a gap between the active-matrix substrate 1 and an external member equals a predetermined gap, on the bonding part 13. The diameter is not particularly limited; however, a diameter of 5 to 10 μm is desirable.

To be specific, connection is made as follows: firstly, a photo-curing anisotropic conductive adhesive serving as the bonding part 13 is subjected to a screen process printing on the input/output terminals 14 formed on ends of the active-matrix substrate 1 with a fixed thickness (thickness of about 20 to 50 μm). Next, connecting terminals (not shown) of the TCP substrate 17 are aligned with the input/output terminals 14 formed on ends of the active-matrix substrate 1; namely, the position of the connecting part is determined. Finally, an ultraviolet ray is irradiated (integral light amount: 3000 mJ/cm$^2$) while pressurizing the connecting part between the connecting terminals of the TCP substrate 17 and the input/output terminals 14 at a pressure of 9.8 mPa to 29.4 mPa (10 to 30 kgf/cm$^2$). Thus, the anisotropic conductive adhesive containing the photo-curing resin is cured so as to complete the bonding part 13.

As described above, the anisotropic conductive adhesive containing the photo-curing resin is adopted as the bonding part 13 so as to connect the input/output terminals 14 disposed on the active-matrix substrate 1 and the connecting terminals of the TCP substrate 17; hence, it is not necessary to cure the anisotropic conductive adhesive and to increase adhesion by a heating operation. Therefore, unlike the conventional art, the need for a heating operation of (150° C. or more)×(5–30 seconds) can be eliminated. Therefore, when the TCP substrates 17 are connected to the active-matrix substrate 1, on which the a-Se film has been previously formed, it is possible to prevent degradation in a characteristic such as crystallization of the a-Se film 6, namely, high dark resistance, without conducting heat to the a-Se film 6.

Further, with this arrangement, for example, it is not necessary to adopt a step of disposing the a-Se film 6 and others after the TCP substrates 17 are mounted, in order to prevent the characteristic from being degraded in a heating operation. Hence, for instance, when the substrate, on which the driving ICs 15 and the reading ICs 16 are packaged (mounted), is put into a vacuum chamber and the a-Se film 6 is evaporated, it is possible to prevent damage on the driving ICs 15 and the reading ICs 16, and a special system for transporting the substrate is not necessary for preventing the damage. Consequently, it is possible to efficiently and economically manufacture the two-dimensional image detector.

When the members are mounted by using a conventional thermosetting anisotropic conductive adhesive containing a thermosetting resin, in a TCP method, a phenomenon is confirmed in which a temperature of the a-Se film rises to 80–100° C. around the image pick-up area, and accordingly, a reduction in dark resistance of the a-Se film is confirmed. However, as described in the present embodiment, when an anisotropic conductive adhesive containing a photo-curing resin is adopted as the bonding part 13, a temperature of the a-Se film does not rise at all, causing no degradation of the above characteristic of the a-Se film.

Incidentally, upon irradiating an ultraviolet ray onto the photo-curing anisotropic conductive adhesive, it is necessary to emit an ultraviolet ray, as indicated by an arrow "a" of FIG. 2, from the back of the active-matrix substrate 1, namely, from a surface on which no input/output terminals 14 are disposed.

However, generally, the input/output terminals are simultaneously made of materials, which are used for forming the gate electrode and the source electrode, on ends of the active-matrix substrate. Therefore, when the gate electrode and the source electrode are made of a material such as a metal film, which cannot transmit light or can hardly transmit light, if an ultraviolet ray is irradiated from the back of the active-matrix substrate, irradiation of light such as an ultraviolet ray may not be possible on the photo-curing anisotropic conductive adhesive, depending upon widths of the input/output terminals, so that it is not possible to sufficiently transmit light such as an ultraviolet ray. Consequently, it is not possible to sufficiently develop a curing reaction (photo-reactivity) of the photo-curing anisotropic conductive adhesive, so that enough adhesion cannot be obtained in some cases.

Here, referring to FIG. 10, in order to show diffraction effect of an ultraviolet ray to the input/output terminals (connecting terminals), Table 2 shows measurement results of a curing rate (%) of the photo-curing anisotropic conductive adhesive, relative to a width L (distance from an origin O to a evaluation point P, the origin O is positioned at a side end 42a of the wire 42) of a wire 42 disposed on a bonding part, which is connected with a glass substrate 45 serving as an external member. At this time, an ultraviolet ray is emitted onto wires 42 serving as the input/output terminals 14, from the back of a substrate 43 serving as the active-matrix substrate 1. The measuring method and the measuring conditions are described later.

As shown in FIG. 10, a curing rate of the photo-curing anisotropic conductive adhesive relative to a width L of the wire 42 is measured as follows: the substrate 43, which is provided with the wires 42 made of a material being unable to transmit an ultraviolet ray, is disposed such that a surface where the wires 42 are formed opposes the glass substrate 45 via the photo-curing anisotropic conductive adhesive 44; an ultraviolet ray is emitted to the side end 42a of the wire 42 at a 45° angle from the back of the surface of the glass substrate 41 where the wire 42 is formed; and a degree of photo-reactivity is found at the evaluation point P based on an absorption spectrum, which is measured by using an FT-IR micro-system (Fourier Transform Infrared Spectrophotometer).

Further, an ultraviolet ray is emitted under the condition of 30 nW/cm$^2$×10 seconds. Each of the glass substrates 41 and 45 is 1.1 mm in thickness. Moreover, as the photo-curing anisotropic conductive adhesive, an epoxy metamorphosed acrylic anisotropic conductive adhesive is adopted, in which 5 μm-diameter resin particles are dispersed. The substrate 43 and the glass substrate 45 are disposed so as to oppose each other at a bonding part such that a gap is 5 μm on a part where the wire 42 is formed; namely, a gap "g" is 5 μm between the glass substrate 45 and the wire 42 disposed on the glass substrate 41 of the substrate 43. Furthermore, an Al (aluminum) wire is used as the wire 42.

TABLE 2

| L (μm) | 10 | 20 | 50 | 100 | 200 |
|---|---|---|---|---|---|
| CURING RATE (%) | 94 | 93 | 91 | 86 | 78 |

The larger the width L of the wire 42 is, the smaller curing rate (%) of the evaluation point P is. When the width L of the wire 42 exceeds 50 μm, a reduction in the curing rate tends to be larger.

Further, it is desirable to set the curing rate at 90% or more to obtain enough bonding strength. For this reason, with reference to the curing rate of 90% or more, in order to obtain a sufficient diffraction effect of an ultraviolet ray, the width L of the wire 42 is preferably set at 50 μm or less, more preferably at 20 μm or less, and most preferably at 10 μm or less.

However, generally, a photo-curing anisotropic conductive adhesive has smaller bonding strength as compared with an epoxy thermosetting anisotropic conductive adhesive. Therefore, in the case of the input/output terminals 14 which are simply formed to be smaller in width, when a photo-curing anisotropic conductive adhesive is used as the anisotropic conductive adhesive, the bonding strength cannot be sufficiently secured. Moreover, in view of accuracy of patterning, the width L of the wire 42 is preferably set at 2 μm or more, more preferably at 3 μm or more, and most preferably at 5 μm or more.

Hence, when an ultraviolet ray (light) is emitted from the back of the active-matrix substrate, at least a part of the input/output terminal disposed near the bonding part needs to transmit light in order to sufficiently develop a photoreactivity (photo-curing reaction) of the anisotropic conductive adhesive. When an ultraviolet ray (light) is emitted from the back of the active-matrix substrate, it is desirable to sufficiently develop a photo-reactivity of the photo-curing (photoreactive) conductive adhesive in accordance with a diffraction effect of the ultraviolet ray (light) to the surface of the input/output terminal.

Hence, in the present embodiment, in order to allow light such as an ultraviolet ray to reach the anisotropic conductive adhesive disposed on the input/output terminals 14 even when light is emitted from the back of the active-matrix substrate 1, the input/output terminal 14 has the following construction.

Figure 3:
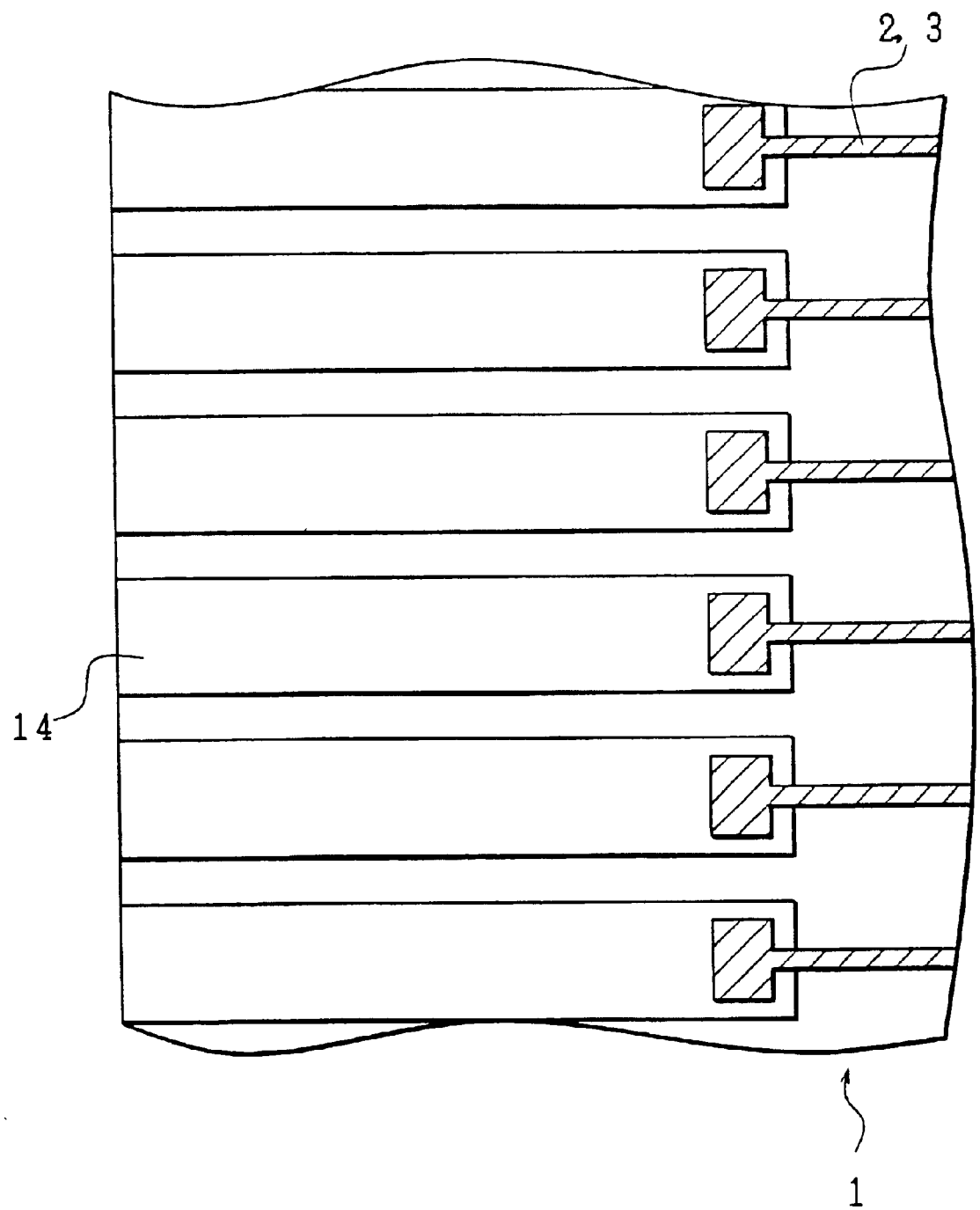
FIG. 3 is an enlarged view showing an example of input/output terminals disposed on ends of an active-matrix substrate of the two-dimensional image detector in accordance with one embodiment of the present invention.

FIG. 3 is an enlarged view showing the input/output terminals 14 disposed on the active-matrix substrate 1 of the present embodiment. Here, as the input/output terminals 14, plate electrodes made of ITO (indium-tin oxide) are adopted, that can transmit light such as a visible ray and a ultraviolet ray. Namely, the input/output terminals 14 are made of a material which can transmit light; thus, the input/output terminals 14 themselves positioned near the bonding part 13 are able to transmit light.

Generally, as for the electrode wires (gate electrode and source electrode) of the active-matrix substrate, it is desirable to use metal electrodes made of materials such as Ta (tantalum), Al (aluminum), and Mo (molybdenum), in order to respond to the need for maintaining a resistance value within a fixed range. Thus, as shown in FIG. 3, in the present embodiment, only the input/output terminals 14 are formed into plates by a material transmitting light, and as for gate electrodes 2 and source electrodes 3 that extend from the input/output terminals 14 as electrode wires, metal electrodes are used.

With a thickness of 0.1 to 0.2 μm, the ITO can sufficiently transmit an ultraviolet ray as well as a visible ray. Therefore, the input/output terminal 14 having the above constructions is adopted so as to emit an ultraviolet ray from the back (surface being opposite to a surface on which the input/output terminals 14 are formed) of the active-matrix substrate 1 and to sufficiently cure the anisotropic conductive adhesive; thus, the bonding part 13 is formed.

However, when the input/output terminal 14 is made of ITO, the glass substrate and the ITO obtain absorbing ends for absorbing an ultraviolet ray, at a wavelength of about 350 μm. Therefore, in this case, it is not possible to cure a photo-curing anisotropic conductive adhesive by using an ultraviolet ray having a wavelength shorter than the above absorbing end. Hence, in this case, as a photoreactive resin used for the anisotropic conductive adhesive, it is possible to adopt a resin which reacts to light having a wavelength longer than that of the absorbing end, and preferably a material which is frequently adopted for industrial use and is cured at a wavelength of 365 nm (i-ray ultraviolet ray), or a resin (material) which is cured with light (light such as blue light in a visible area) whose wavelength is longer than 365 nm.

In the same manner, when the input/output terminals 14 are made of a material being able to transmit light, as for the above photoreactive anisotropic conductive adhesive, it is possible to adopt a material being photoreactive to light whose wavelength is determined in accordance with absorption wavelengths of materials forming the input/output terminals 14 and the active-matrix substrate 1, which is disposed on a side where light is emitted.

Here, a material for the input terminals 14 being able to transmit light is not limited to ITO. For example, a material such as $SnO_2$ and ZnO can be adopted.

When the input/output terminals 14 are formed by a transparent conductive oxide film, the input/output terminals 14 can be readily formed by the following method and others: an electrode wire has a laminated structure in which a metal film is stacked on the transparent conductive oxide film (for example, ITO), and only on parts to be the input/output terminals 14 (particularly, part used for the bonding parts 13), a metal film serving as an upper layer is removed by etching so as to expose the transparent conductive oxide film. In this case, upon etching the metal film, it is possible to entirely etch the terminals (especially, parts corresponding to the bonding parts 13), or as described later in FIG. 4 or 11, the metal film can be etched so as to have a plurality of openings (openings 18).

Figure 4:
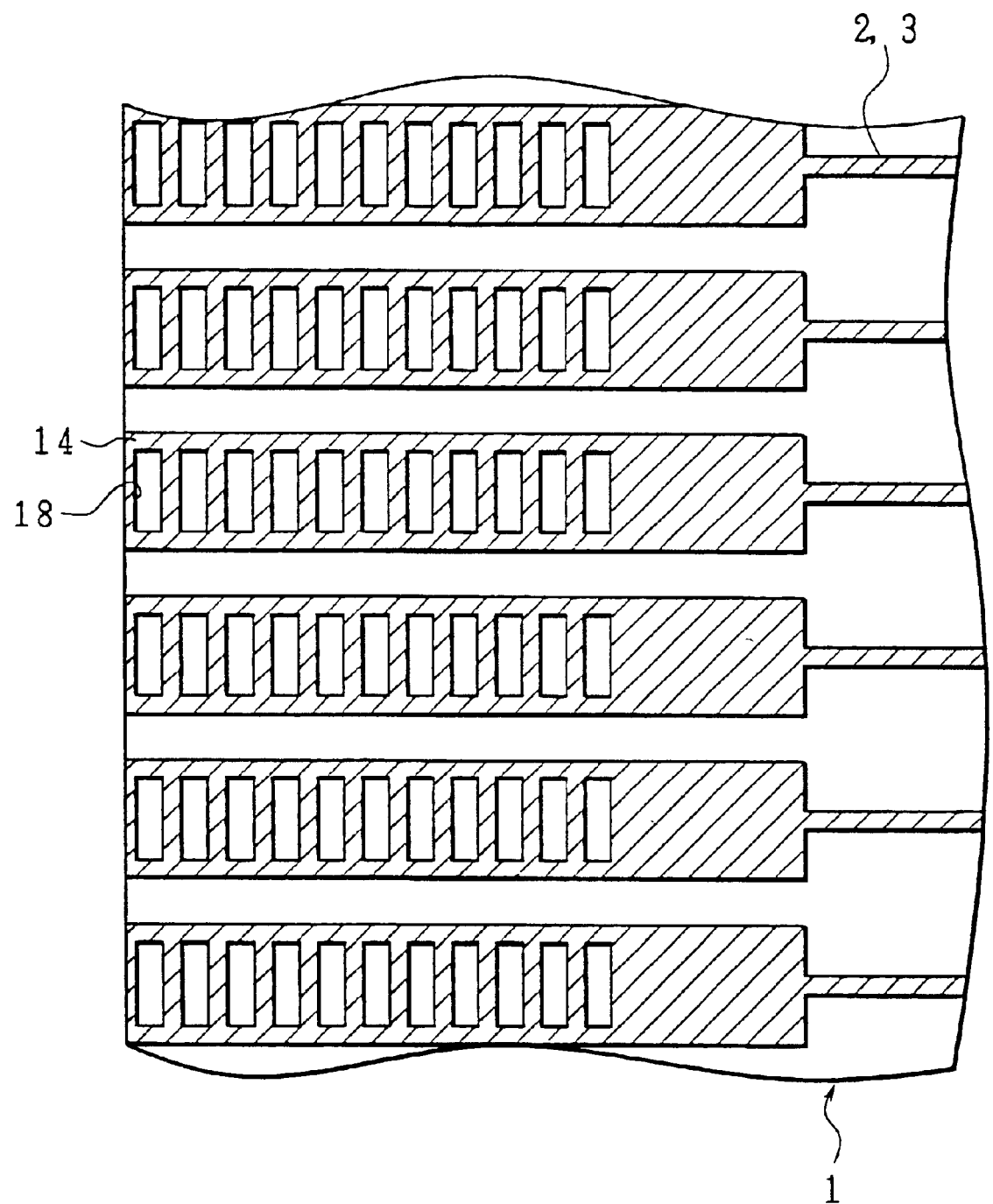
FIG. 4 is an enlarged view showing another example of the input/output terminals disposed on ends of the active-matrix substrate of the two-dimensional image detector in accordance with one embodiment of the present invention.
Figure 11:
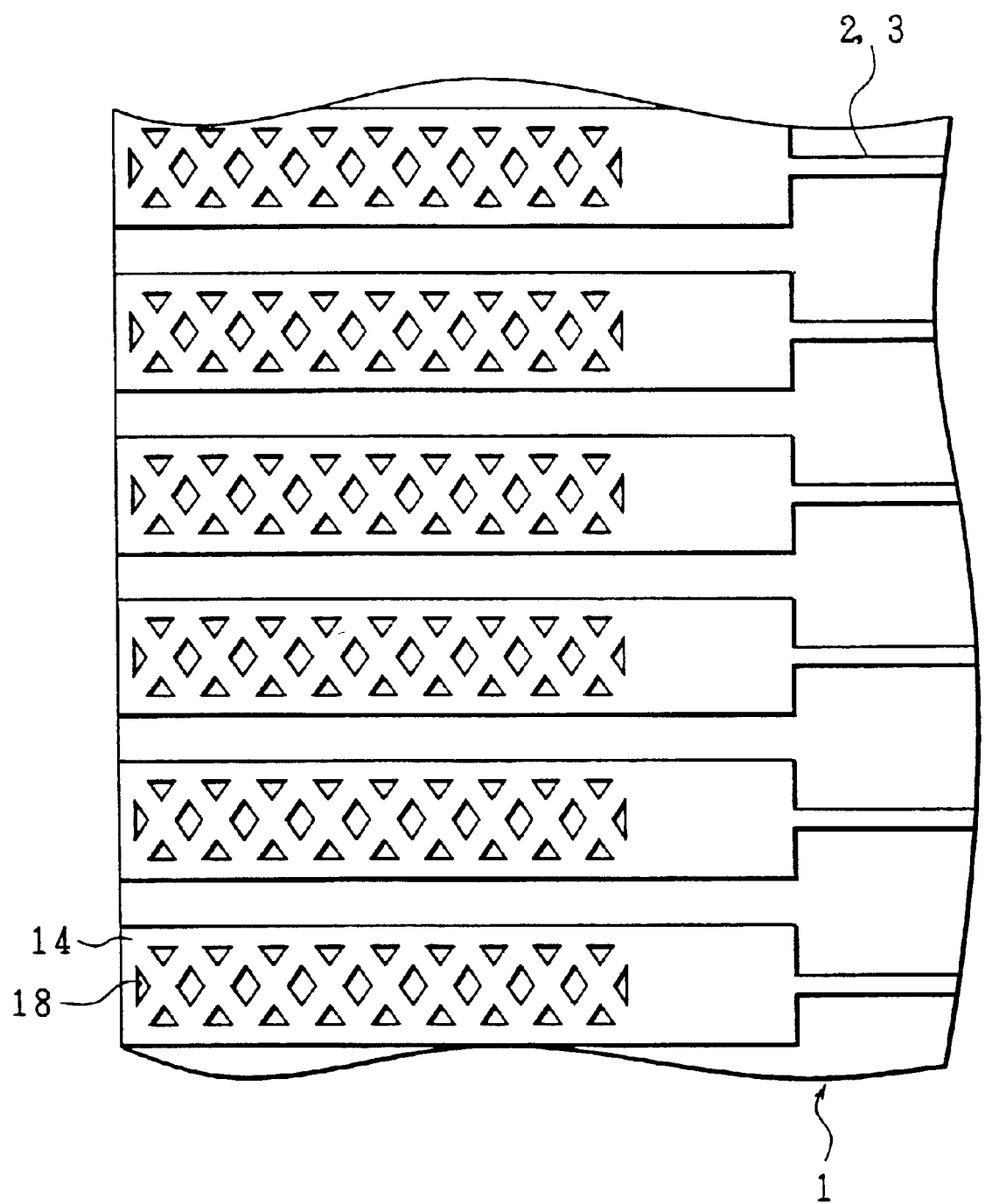
FIG. 11 is an enlarged view showing still another example of the input/output terminals disposed on ends of the active-matrix substrate of the two-dimensional image detector in accordance with one embodiment of the present invention.

Further, as the input/output terminals 14 used in the present embodiment, instead of the input terminals 14 being able to transmit light, it is possible to adopt input/output terminals 14 shown in FIG. 4 or 11. In FIG. 4, a plurality of the openings 18 are formed into stripes so as to penetrate in a thickness direction of the input/output terminals 14, which are formed by plate-shaped metal electrodes. The shape and the number of the openings 18 are not particularly limited. However, as described above, it is desirable to form the metal terminal part with a desirable width, so as to favorably achieves diffraction of an ultraviolet ray to the metal terminal parts (metal parts on the input/output terminals 14) in the electrode wires containing metals and to sufficiently cure the photo-curing anisotropic conductive adhesive. Therefore, the width of the metal terminal part on the bonding part 13 is preferably set at 50 μm or less, more preferably at 20 μm or less, most preferably at 10 μm or less. In order to obtain favorable patterning accuracy, the width of the metal terminal part on the bonding part 13 is preferably set at 2 μm or more, more preferably at 3 μm or more, and most preferably at 5 μm or more. Thus, in the present embodiment, 200 of openings 18 (slit patterns) having an L/S ratio (Line/Space ratio) of 5 μm/5 μm are formed for each of the input/output terminals 14. Here, for convenience of understanding, only 11 of them are shown in FIG. 4.

In FIG. 11, on the input/output terminals 14 formed by plate-shaped metal electrodes, a plurality of the openings 18 are formed into a mesh (lattice form) so as to penetrate the input/output terminals 14 in a thickness direction. In this case as well, the shape and the number of the openings 18 are not limited. However, for the aforementioned reason, in the present embodiment, the openings 18 having an L/S ratio (Line/Space ratio) of 5 μm/5 μm are formed for each of the input/output terminals 14. Here, for convenience of understanding, a smaller number of them are shown in FIG. 11.

In such a construction having the openings 18, it is possible to emit light such as an ultraviolet ray from a plurality of the openings 18 disposed on the input/output terminals 14. Thus, for instance, it is possible to emit an ultraviolet ray from the back of the active-matrix substrate 1 so as to sufficiently cure the anisotropic conductive adhesion. Further, the gate electrodes 2 and the source electrodes 3, that extend from the input/output terminals 14 as electrode wires, can be made of the same metals as the above metal electrodes. Hence, it is not necessary to bond connecting parts between the input/output terminals 14 and the electrode wires, resulting in a simpler manufacturing process.

Moreover, the openings 18 are formed with an L/S ratio of 5 μm/5 μm for each of the input/output terminals 14 so as to secure emitted ultraviolet rays in an amount large enough to sufficiently cure the anisotropic conductive adhesive.

Additionally, FIGS. 4 and 11 show an example in which the shape and the size of the opening 18 is set so as to have an L/S ratio of 1 (namely, the line width equals to the space width). However, the L/S ratio does not always have to be set at 1, so that it is only necessary to form the opening 18 with a size and shape corresponding to a degree of diffraction of light emitted to the surfaces of the input/output terminals 14, at the time that, light is emitted in accordance with conditions of light such as an ultraviolet ray from the back of the surface, on which the input/output terminals 14 are formed, of the active-matrix substrate 1.

As described above, when input/output terminals 14 include metal parts (metal terminal parts), adhesion is small between (a) the conductive particles contained in the photo-curing anisotropic conductive adhesive and (b) the metal parts of the input/output terminals 14, it is desirable to maximize areas of metal parts of the input/output terminals 14 around the bonding parts 13. However, in view of a curing property of the photo-curing anisotropic conductive adhesive, it is desirable to maximize opening areas of the openings 18 on the input/output terminals 14 around the bonding parts 13.

Therefore, upon using the photo-curing anisotropic conductive adhesive, when the input/output terminals 14 include metal terminal parts (metal parts), especially when the input/output terminals 14 are metal terminal parts (metal electrodes), an uneven part is formed on a contact surface of the input/output terminal 14 so as to improve contact strength on the contact interface. Moreover, in this case, as shown in FIG. 11, the metal parts of the input/output terminals 14 are formed into a mesh (lattice form), so that a distribution density of height differences can be improved as compared with the slit pattern of FIG. 4, and height differences can be distributed evenly in a two-dimensional manner (X and Y directions). Consequently, the input/output terminal 14 having the construction of FIG. 11 is quite favorable because it is possible to sufficiently satisfy the curing property and the bonding strength of the photo-curing anisotropic conductive adhesive, to prevent degradation in characteristics of the amorphous semiconductor layer while maintaining a resistance value within a fixed range, and to maintain sensitivity to detect an image.

Additionally, the present embodiment does not particularly limits the L/S ratio of the openings 18 in each of the input/output terminals 14 and the number of the openings 18 formed in each of the input/output terminals 14. Any other condition can be adopted as long as the bonding part 13 is formed by a photo-curing process.

A method for forming the openings 18, namely, a method for forming the metal pattern of the input/output terminals 14 is not particularly limited to the method of the present embodiment, so that an ordinary etching technology and the like can be adopted to readily form the openings 18 and the metal pattern.

Furthermore, when the input/output terminals 14 are provided with metal terminal parts, the metal terminal parts can be formed by materials which are different from those of electrode wires such as the gate electrodes 2 and the source electrodes 3. For example, only parts to be the input/output terminals 14 are slated with materials having different resistance values, for example, metal materials having low resistance values, or slated with metal materials having superior adhesion with the conductive particles, or it is possible to adopt a laminated structure in which different metal films are stacked. With this arrangement, for example, it is possible to favorably maintain a bonding strength between the photo-curing anisotropic conductive adhesive and the input/output terminals 14.

Figure 12A:
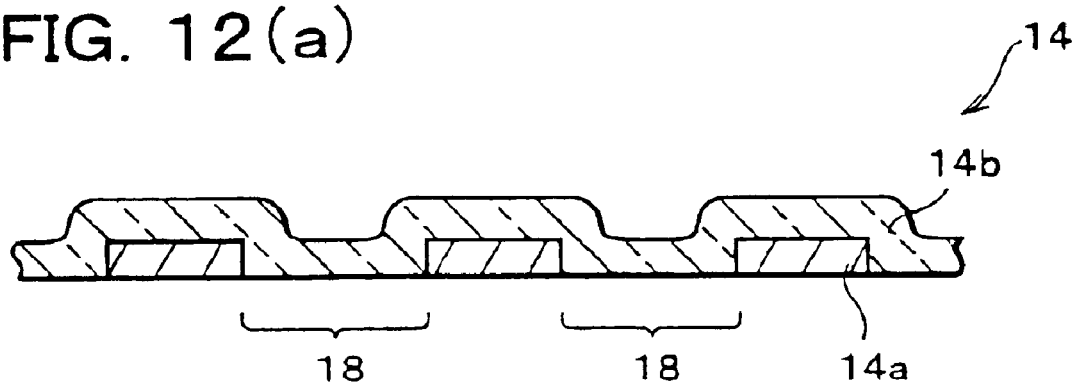
FIG. 12(a) is a sectional view showing a construction in which a transparent conductive oxide film is stacked on metal terminal parts, as an example of the input/output terminals disposed on ends of the active-matrix substrate of the two-dimensional image detector in accordance with one embodiment of the present invention.
Figure 12B:
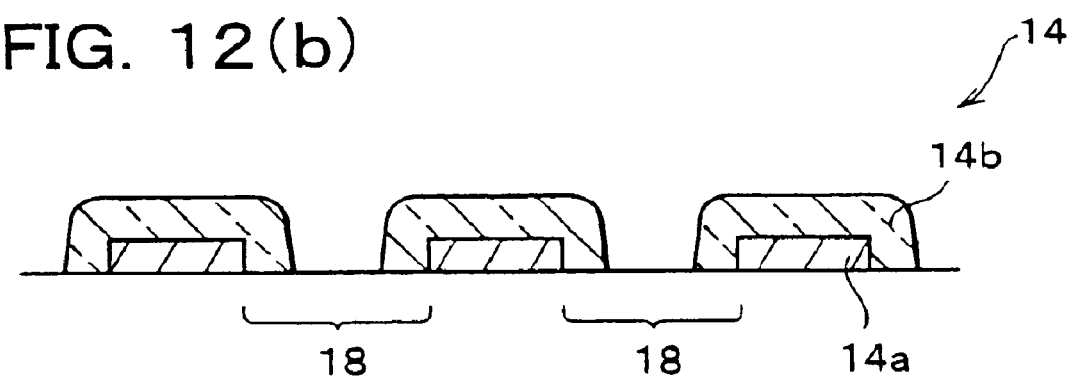
FIG. 12(b) is a sectional view showing another construction in which a transparent conductive oxide film is stacked on metal terminal parts, as an example of the input/output terminals disposed on ends of the active-matrix substrate of the two-dimensional image detector in accordance with one embodiment of the present invention.

Further, as shown in FIGS. 12(*a*) and 12(*b*), it is also possible to adopt the following laminated structure: a film such as a transparent conductive oxide film 14*b*, that is made of a material such as ITO, is stacked on metal terminal parts 14*a*, in which the openings 18 are formed on the terminal parts (especially, parts corresponding to the bonding area 13) of the metal electrodes, which are formed into the input/output terminals 14. Thus, even when the openings 18 are provided on the terminal parts of the metal electrodes, it is desirable to stack the transparent conductive oxide film 14*b* made of a material such as ITO onto the terminal parts (metal terminal parts 14*a*) in order to prevent oxidization on the surfaces of the terminal parts (metal terminal parts 14*a*).

As shown in FIG. 12(*a*), it is also possible to adopt the following construction: the transparent conductive oxide film 14*b* is disposed so as to entirely cover the surface of the metal terminal parts 14*a* and the openings 18, so that the openings 18 are blocked with the transparent conductive oxide film 14*b*. Further, as shown in FIG. 12(*b*), another construction is available, in which except for the openings 18, the metal terminal parts 14*a* are covered with the transparent conductive oxide films 14*b* by etching, photolithography using a photomask, and other methods.

As described above, in the case of the input/output terminals 14 being provided with the metal terminal parts, when directivity of light such as an ultraviolet ray is too high and the light is emitted from the back of the active-matrix substrate 1, the light hardly diffracts to the anisotropic conductive adhesive, which is photoreactive and is formed on the metal pattern. Therefore, when the input/output terminals 14 are provided with the metal terminal parts, as for light emitted to the anisotropic conductive adhesive having photo-reactivity (the photoreactive anisotropic conductive adhesive), it is desirable to adopt a light irradiating apparatus (for example, an irradiating apparatus for an ultraviolet ray), in which the directivity is low or irradiation components are large (large radiation angle) in a diagonal direction.

Embodiment 2

In Embodiment 1, a paste-type photo-curing anisotropic conductive adhesive is adopted for the bonding part 13. However, the present invention is not limited to this arrangement. For example, it is also possible to adopt an anisotropic conductive adhesive in a film form, as mentioned below. Here, in the explanation of a two-dimensional image detector of the present embodiment, for convenience of explanation, those members that have the same functions and that are described in Embodiment 1 are indicated by the same reference numerals and the description thereof is omitted.

When a film-type anisotropic conductive adhesive is adopted as a bonding part 13, the anisotropic conductive adhesive is formed into a film itself. Thus, it is necessary to firstly soften films constituting the anisotropic conductive adhesive before transferring the adhesive onto a substrate, namely, an active-matrix substrate 1.

To be specific, firstly, the film-type photo-curing anisotropic conductive adhesive is transferred onto input/output terminals 14 formed on ends of the active-matrix substrate. The transfer requires a heating operation (about 100° C.×several seconds) and a pressurizing operation at 9.8 mPa (10 kgf/cm$^2$). Next, connecting terminals of a TCP substrate 17 are aligned with the input/output terminals 14 formed on ends of the active-matrix substrate 1; namely, the positions of connecting parts are determined. Finally, the heating operation (about 100° C.×several seconds) is performed so as to soften the films constituting the anisotropic conductive adhesive while pressurizing the connecting part of the TCP substrate 17 at a pressure of 9.8 mPa to 29.4 mPa (10 to 30 kgf/cm$^2$), and then, an ultraviolet ray is emitted (integral light amount: 3000 mJ/cm$^2$) thereon so as to cure the anisotropic conductive adhesive.

When the active-matrix substrate 1 is connected to the TCP substrate 17 by using the above method, a heating operation (about 100° C.×several seconds) is necessary for softening the anisotropic conductive adhesive; however, unlike the conventional art, a heating operation of (150° C. or more)×(5 to 30 seconds) is not necessary.

Therefore, when the TCP substrate 17 is connected to the active-matrix substrate 1 on which an a-Se film 6 has been previously formed, heat is hardly conducted to the a-Se film 6. Thus, it is possible to prevent degradation in a characteristic of crystallization occurring in the a-Se film 6, namely, high dark resistance.

Actually, in a process for softening the film-type anisotropic conductive adhesive serving as the bonding part 13, even when a heating operation of (about 100° C.)×(five minutes) is performed, the heat conducted to the a-Se film 6 is 50° C. or less, so that the above characteristic of the a-Se film 6 is not degraded.

As described in the present embodiment, when a film-type photo-curing anisotropic conductive adhesive is used as a bonding part, a heating operation of (about 100° C.×several seconds) is necessary. However, the bonding part of the present embodiment contains a photo-curing resin as described above, so that a heating operation is not necessary for thermosetting; consequently, it is possible to connect input/output terminals without degradation in a characteristic of an amorphous semiconductor layer.

Embodiment 3

In Embodiment 1, the photo-curing anisotropic conductive adhesive is used to connect the active-matrix substrate and the TCP substrate. However, the present invention is not limited to this arrangement. Here, for convenience of explanation, in the construction of a two-dimensional image detector of the present embodiment, those members that have the same functions and that are described in Embodiment 1 are indicated by the same reference numerals and the description thereof is omitted.

To be specific, for example, a photo-curing anisotropic conductive adhesive is adopted for a connection between an active-matrix substrate and a driving IC or a reading IC (COG connection), a connection between an FPC substrate and the active-matrix substrate, and a connection of input/output terminals which have been conventionally connected (mounted) via a thermosetting anisotropic conductive adhesive and a thermoplastic anisotropic conductive adhesive.

Figure 5:
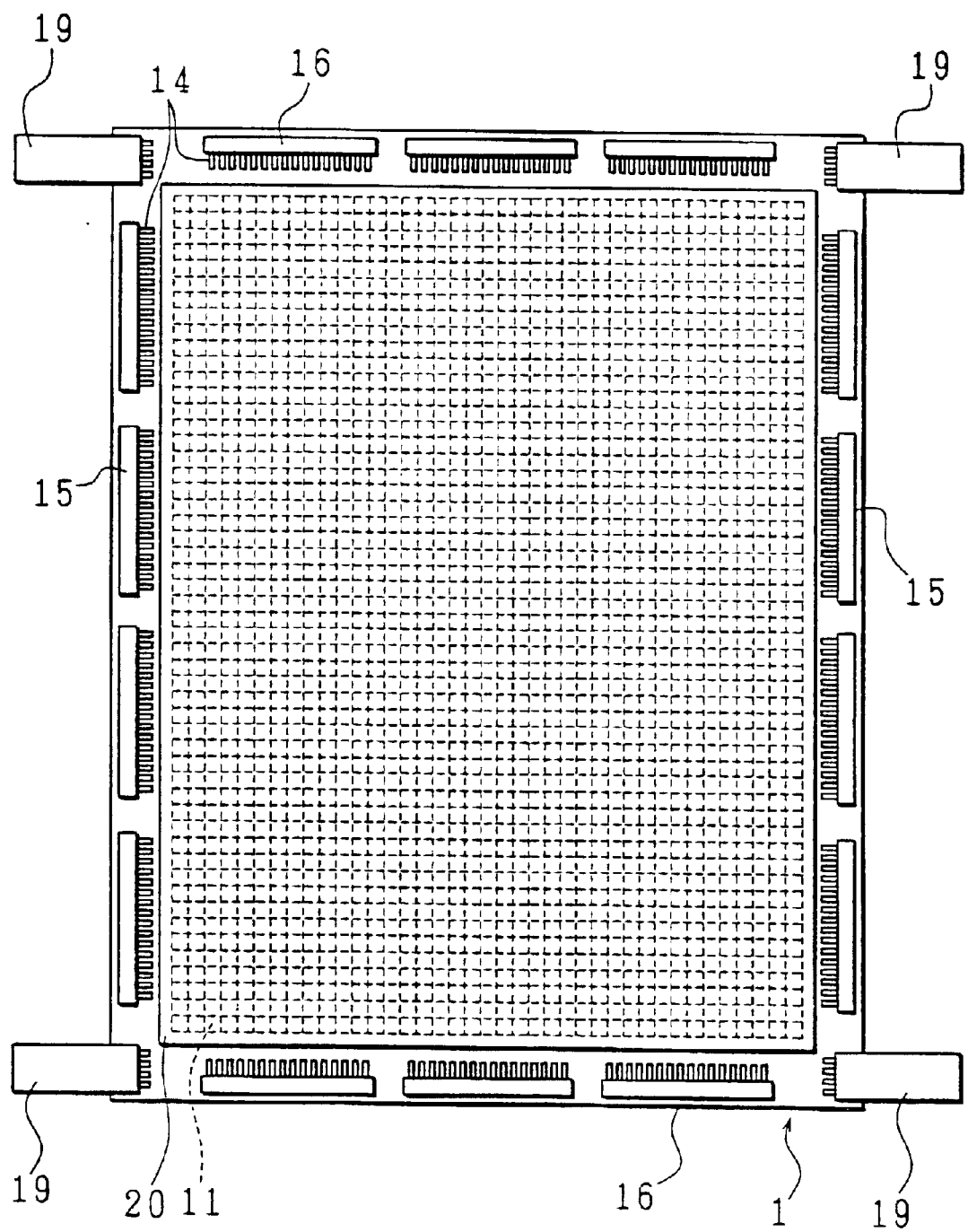
FIG. 5 is a plan view schematically showing the entire construction of the two-dimensional image detector in accordance with another embodiment of the present invention.
Figure 6:
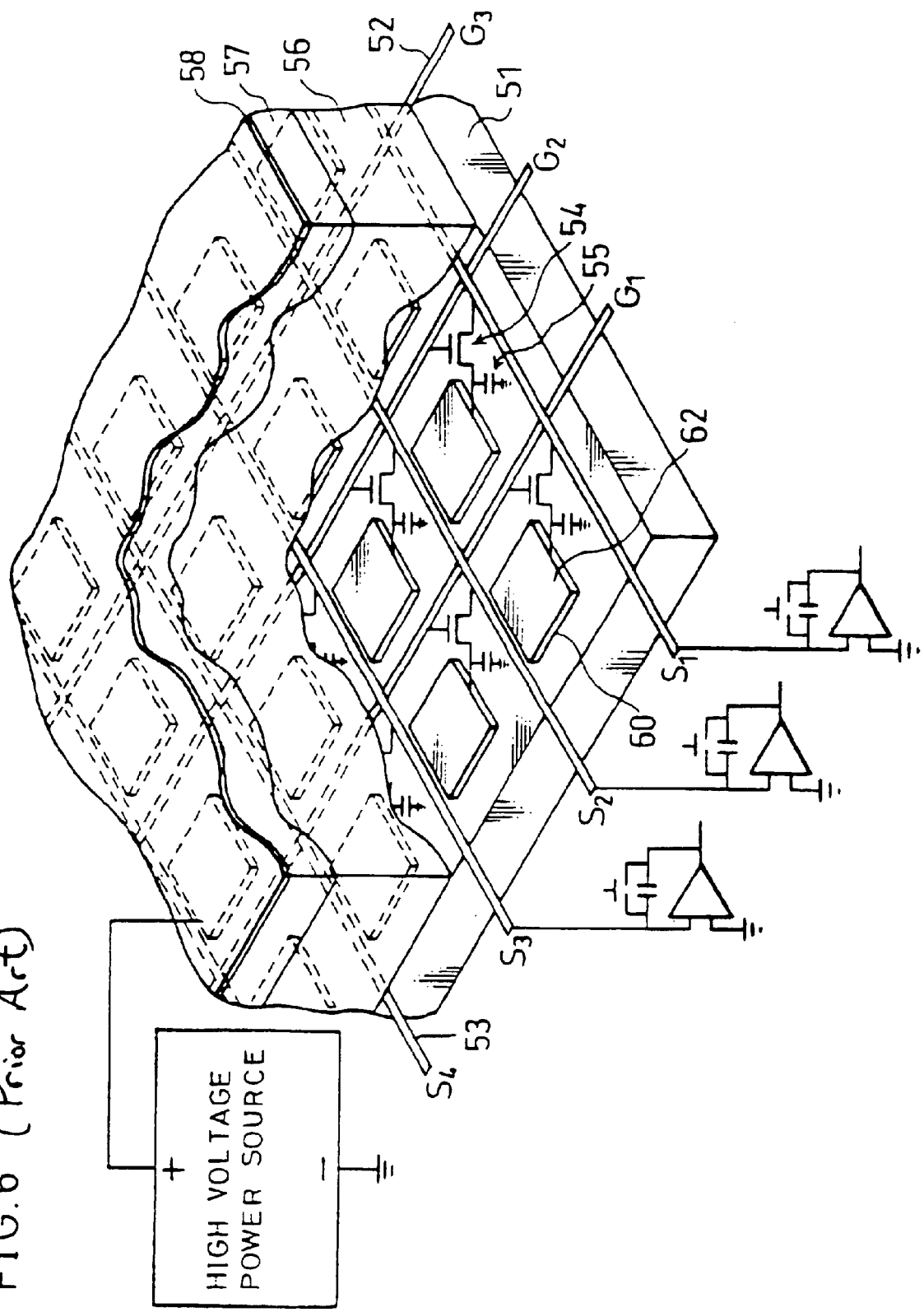
FIG. 6 is a perspective view showing the construction of a typical two-dimensional image detector.
Figure 7:
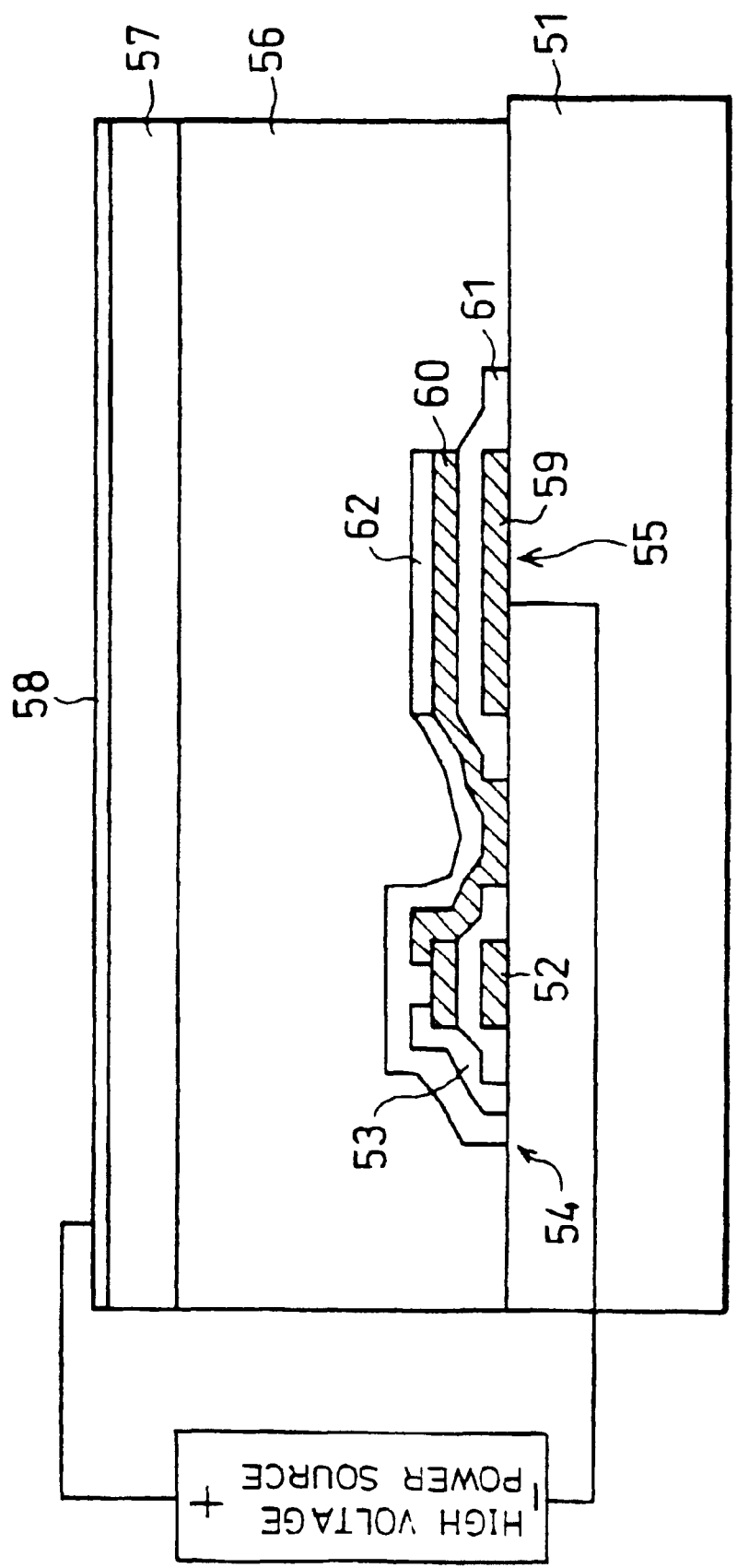
FIG. 7 is a sectional view showing the construction of one pixel disposed in a typical two-dimensional image detector.
Figure 8:
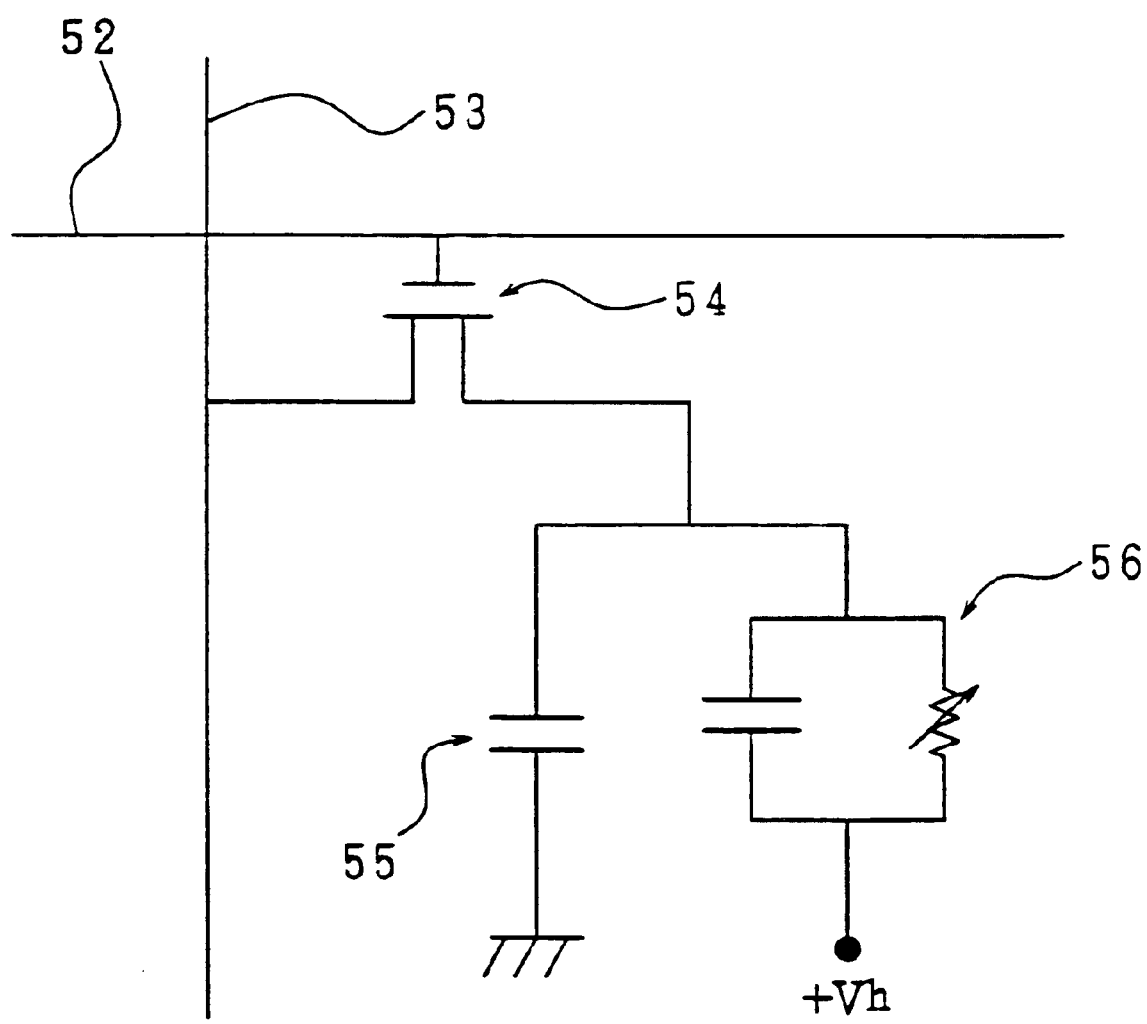
FIG. 8 is a circuit diagram showing an equivalent circuit of one pixel disposed in a typical two-dimensional image detector.

FIG. 5 is a plan view showing a module in which the driving ICs 15 and the reading ICs 16 are mounted directly on the active-matrix substrate 1 by COG method, and an FCP substrate 19 is used for connecting the active-matrix substrate 1 and the external circuit substrate (not shown).

Here, in the figure, the driving ICs 15 and the reading ICs 16 are described in smaller numbers for convenience of understanding. In the two-dimensional image detector of FIG. 5 as well, the same effect can be achieved by using the bonding part 13 described in Embodiments 1 and 2, upon mounting the driving ICs 15 and the reading ICs 16 and upon connecting (mounting) the FPC substrate 19.

As described above, Embodiments 1 through 3 mainly discuss the two-dimensional image detector for an X-ray (radiation). However, the present invention is not limited to these arrangements. When a used semiconductor (electromagnetic wave conductor) exhibits electromagnetic wave conductivity to a visible ray and an infrared ray as well as to a radiation such as an X-ray, the two-dimensional image detector can be used for a visible ray and an infrared ray.

For example, the above a-Se film has favorable electromagnetic wave conductivity to a visible ray. A highly sensitive image sensor, which uses an avalanche effect obtained by applying a high electric field, has been developed, so that the a-Se film can be adopted for such a two-dimensional image detector for a visible ray image.

Further, the crystallization (degradation in a characteristic) caused by heating the a-Se film is not limited to the a-Se film. Although a crystallizing temperature is varied, the crystallization is a common phenomenon for all kinds of amorphous materials. Thus, an amorphous material other than the a-Se film such as the a-Si film, the a-SiC film, and a-SiGe film are also available as an electromagnetic wave conductor.

Further, the usage of the active-matrix substrates described in Embodiments 1 through 3 is not limited to the above two-dimensional image detector but is applicable to an active-matrix substrate used for a liquid crystal display device. In recent years, there has been a growing need for a larger model, higher definition, and lower cost regarding a display device using the active-matrix substrate. Particularly, in order to realize high definition, upon connecting the input/output terminals of the active-matrix substrate (mainly input terminals in a display device) to the outside, high connecting accuracy is required. Hence, in order to lower a heating temperature upon connecting and to prevent thermal expansion of the substrate and the connecting members from causing degradation in positioning accuracy, it is desirable to use a photoreactive anisotropic conductive adhesive, which allows connection with a low-temperature operation.

Therefore, in such a liquid crystal display device as well, the active-matrix substrate 1, particularly the active-matrix substrate 1 having constructions of FIG. 3, FIG. 4, FIG. 11, FIG. 12(a), and FIG. 12(b) makes it possible to readily use an anisotropic conductive adhesive, which shows photoreactivity, as an adhesive for connecting the outside and the input/output terminals 14 serving as connecting terminals.

Namely, the active-matrix substrate of the present invention is applicable to a display device as well as a two-dimensional image detector, so that the active-matrix substrate can be suitably used as an electrode substrate of the display device. Here, Embodiments 1 through 3 discuss the two-dimensional image detector using the active-matrix substrate 1; however, Embodiment 4 describes an example in which the active-matrix substrate 1 is used as a display device of a liquid crystal display device.

Embodiment 4

Figure 13:
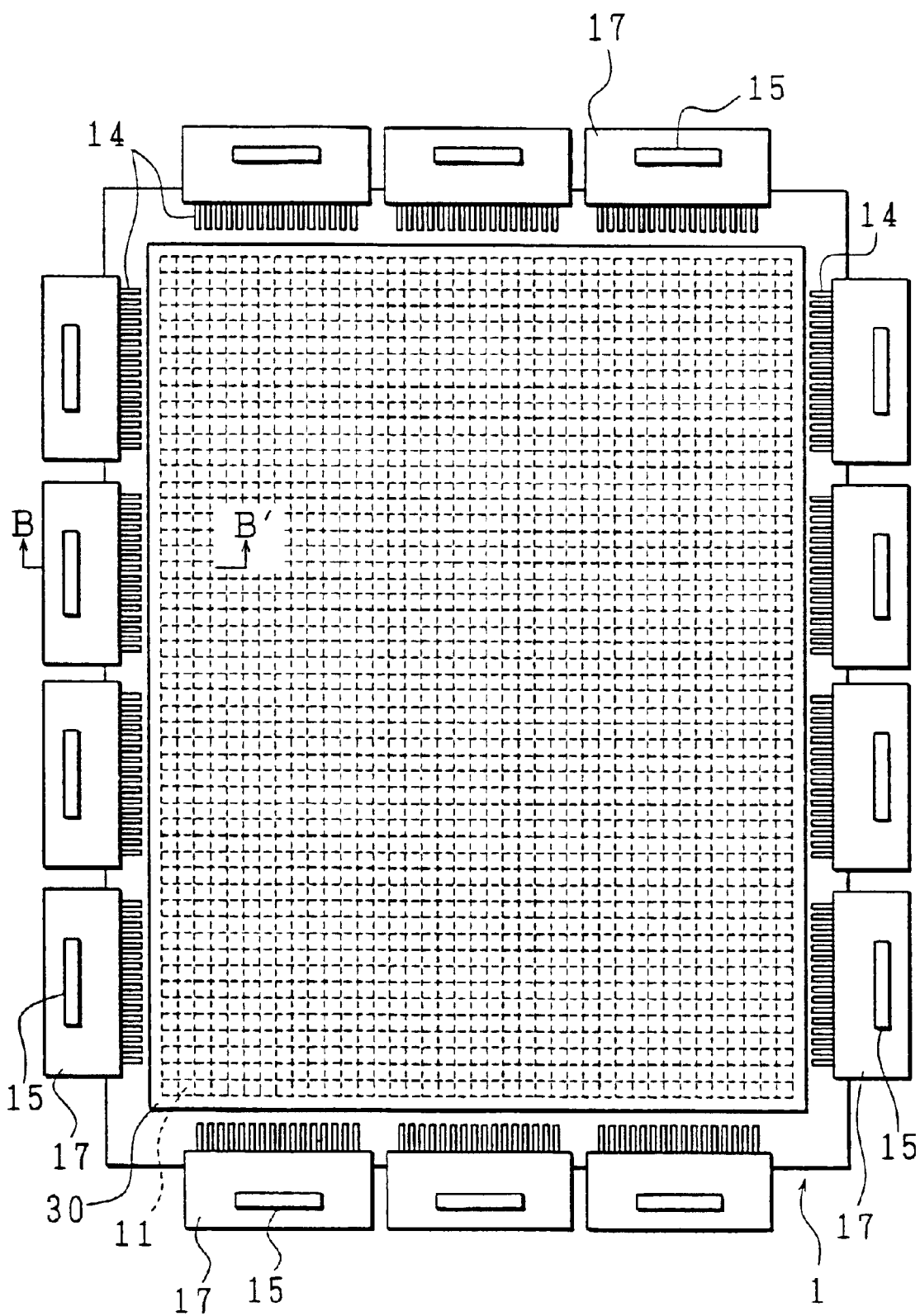
FIG. 13 is a plan view schematically showing the entire construction of a liquid crystal display device in accordance with another embodiment of the present invention.
Figure 14:
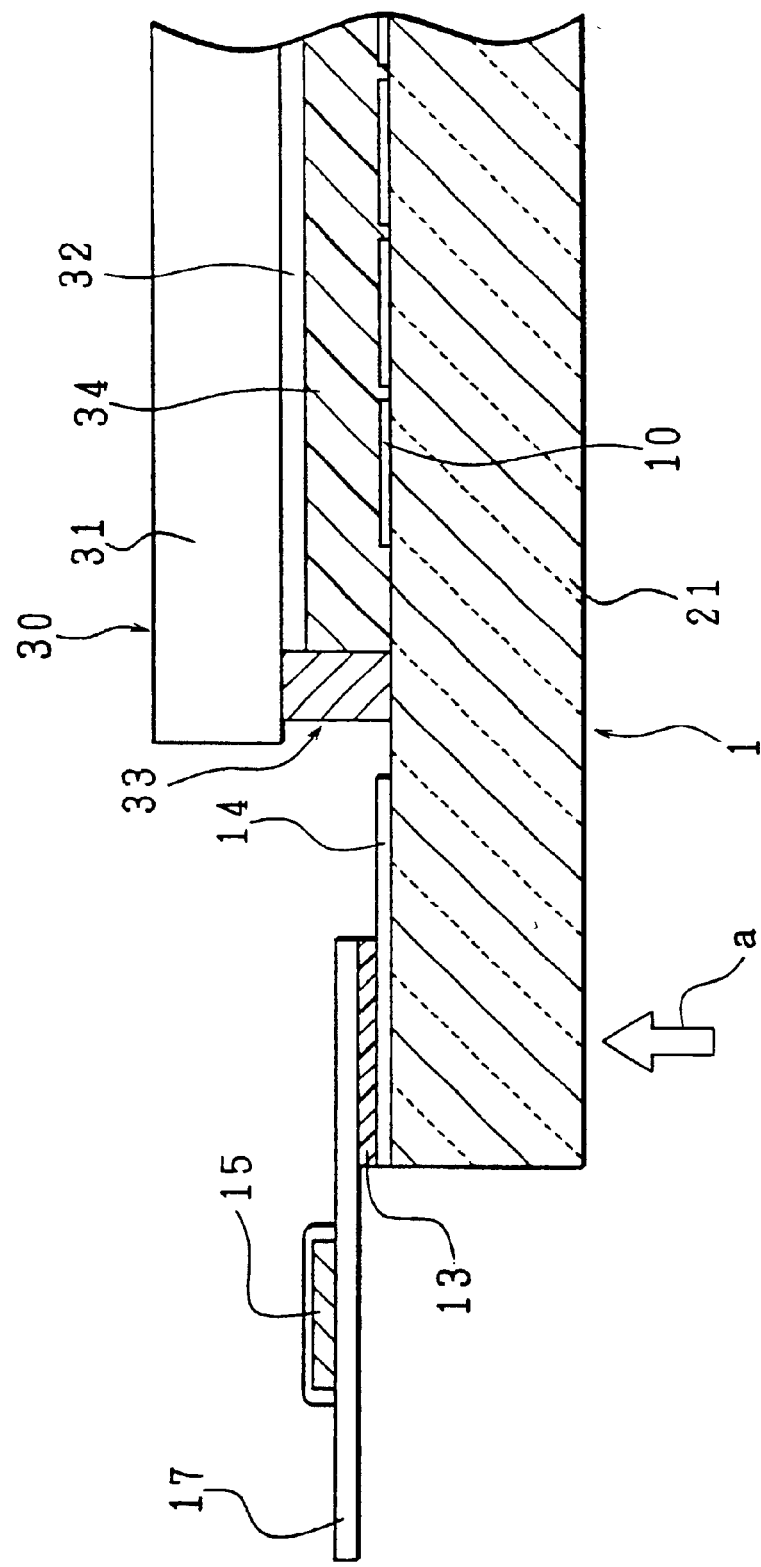
FIG. 14 is a sectional view taken along line B–B' shown in FIG. 13.
Figure 15:
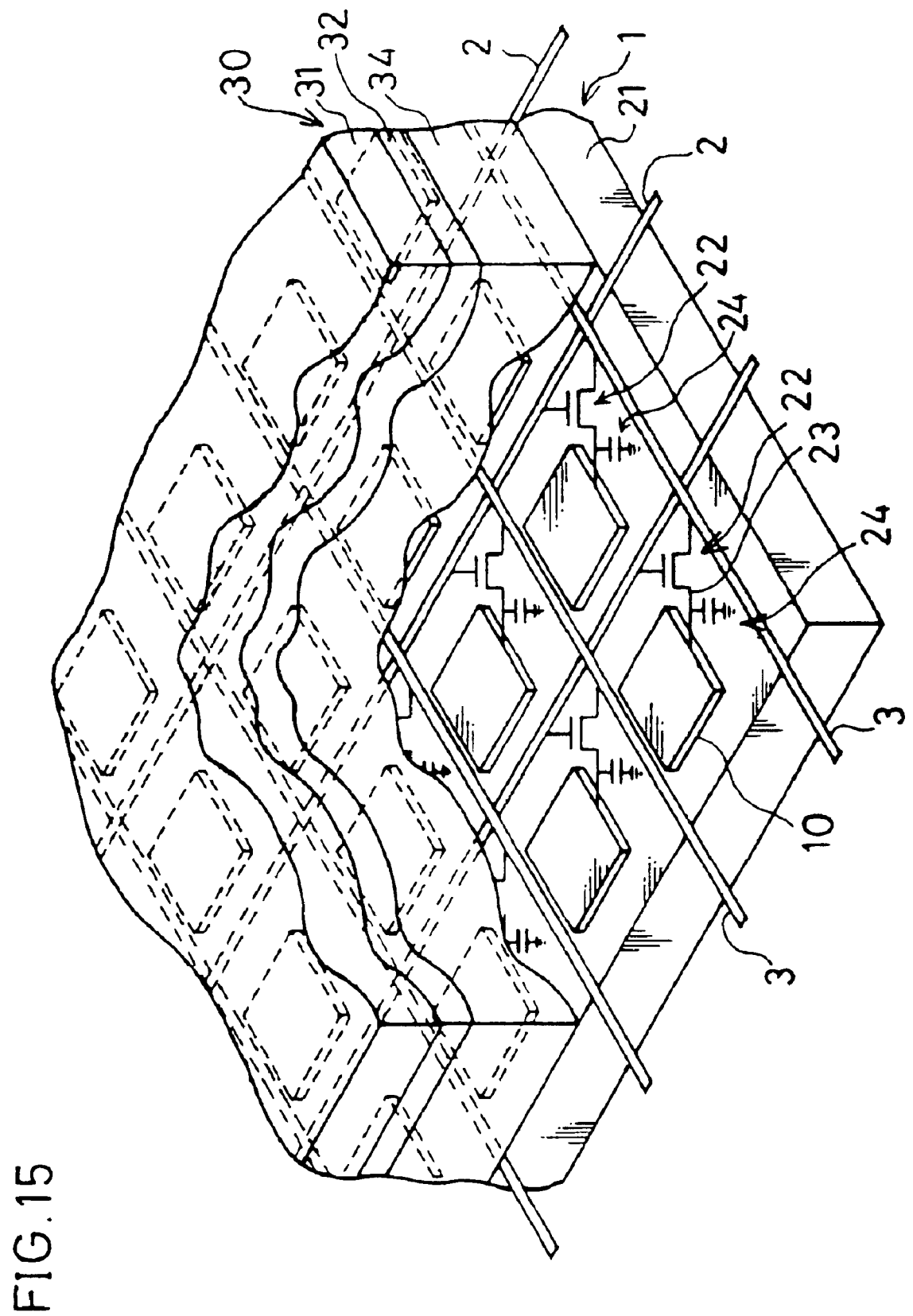
FIG. 15 is a perspective view schematically showing the construction of the liquid crystal display device.

Referring to FIGS. 13 through 15, the following explanation describes the present embodiment. Here, for convenience of explanation, those members that have the same functions and that are described in Embodiments 1 through 3 are indicated by the same reference numerals and the description thereof is omitted.

FIG. 13 is a plan view schematically showing the entire construction of a liquid crystal display device in accordance with the present embodiment. FIG. 14 is a sectional view taken along line B–B' shown in FIG. 13. Further, FIG. 15 is a perspective view schematically showing the construction of the liquid crystal display device.

As shown in FIGS. 14 and 15, an active-matrix substrate 1 used in the liquid crystal display element has a construction in which a plurality of the pixel electrodes 10 are disposed in an XY matrix form (lattice form) on a transparent insulating substrate (light-transmitting substrate)21 made of a material such as glass.

As shown in FIG. 15, gate electrodes 2 serving as scanning electrodes and source electrodes serving as signal electrodes are disposed so as to intersect (overlap) one another around the pixel electrodes 10. Moreover, at each of the intersections of the gate electrodes 2 and the source electrodes 3 that are disposed in an XY matrix form (lattice form), namely, at each of the lattice points, a TFT (thin film transistor)22 connected to the pixel electrode 10 is disposed as a switching element (active element) for electively driving the pixel electrodes 10 which apply voltage to a display (electro-optical medium, described later).

Furthermore, a drain electrode 23 of the TFT 22 is connected with the pixel electrode 10 via a contact hole (not shown) or the like and is connected with one of electrodes of a storage capacitor (Cs) 24.

In the present embodiment, the following construction is also acceptable: metal electrodes are used as the gate electrodes 2 and the source electrodes 3, and the transparent conductive oxide film (transparent electrode) is formed thereon or below the electrodes.

A scanning signal is inputted via the gate electrodes 2 so as to control the turning ON/OFF of the TFTs 22. Further, when the TFTs 22 are turned on, a data signal is inputted to the pixel electrodes 10 via the source electrodes 3.

In order to input and output an electronic signal to the gate electrodes 2 and the source electrodes 3, on the ends of the gate electrodes 2 and the source electrodes 3, a plurality of input/output terminals 14 are disposed as connecting terminals which are connected to the outside, namely, as shown in FIG. 13, connected to external members including an electric member and an electric circuit (external circuit) such as the TCP substrate 17.

Meanwhile, as shown in FIGS. 14 and 15, In an opposing substrate 30, an opposing electrode (opposing common electrode)32 formed by a transparent electrode such as ITO is formed entirely on a transparent insulating substrate (light-transmitting substrate) 31 made of a material such as glass. Furthermore, on both substrates, namely, on the opposing surfaces of the active-matrix substrate 1 and the opposing substrate 30, alignment films (not shown), which are subjected to a uniaxial alignment such as a rubbing operation, are formed. The substrates are bonded to each other with a sealing agent 33. A liquid crystal layer 34 serving as a display (electro-optical medium) is sandwiched between the substrates.

Namely, the liquid crystal display device is provided with a transmitting liquid crystal display element in which the active-matrix substrate 1 and the opposing substrate 30 are bonded to each other and liquid crystal is filled into a gap between the substrates.

Moreover, the active-matrix substrate 1 and the opposing substrate 30 can include a construction in which deflecting plates (not shown) and phase difference plates (not shown) are formed on the outside of the package, namely, on the back of the opposing surfaces of insulating substrates 21 and 31, in accordance with a display mode of the liquid crystal layer 34. Also, a reflective display device is available, in which reflective electrodes are used as the pixel electrodes 10.

Further, as for a liquid crystal display device for providing a color display, a color filter layer including a color such as red, green, and blue is disposed on an opposing substrate 30, or a liquid crystal layer for absorbing or reflecting a specific color is used, so that a color display is provided.

As shown in FIG. 13, the liquid crystal display device with the above construction of the present embodiment is provided with a pixel alignment layer 11 on the active-matrix substrate 1, the pixel alignment layer 11 including the electrodes wires (gate electrodes 2 and source electrodes 3) formed into an XY matrix form (lattice form), the switching element (TFT 22) provided at each of the intersections of the electrode wires, namely, in each pixel, the storage capacitors 24, and the pixel electrodes 10. As described above, around the active-matrix substrate 1, a plurality of the input/output terminals 14, that are identical to the input/output terminals 14 shown in FIG. 3, FIG. 4, FIG. 11, FIG. 12(a) and FIG. 12(b) of Embodiment 1, are disposed so as to serve as connecting terminals connected to the outside, namely, to the external members including the electric member and the electric circuit (external circuit) such as the TCP substrate 17.

In FIG. 13, the driving ICs 15 are connected (mounted) to the input/output terminals 14 disposed on the active-matrix substrate 1, by using TCP method. As described above, the input/output terminals 14 are disposed on ends of the active-matrix substrate 1 to input and output an electron signal to the gate electrodes 2 and the source electrodes 3. With this arrangement, the input/output terminals 14 can input an image signal from the external electric circuit in response to a displayed image. Here, in FIG. 13, the number of the connected TCP substrates 17 is smaller than the actual number for convenience of understanding.

In the display device of FIG. 13, the input/output terminals 14 connected with the ends of the gate electrodes 2 act as scanning signal inputting terminals, and the input/output terminals 14 connected with the ends of the source electrodes 3 act as data signal inputting terminals. In such a display device, only a signal inputted from an LSI (Large Scale Integration) exists in the display area, so that the connecting terminals, namely, the input/output terminals 14 are used as input terminals. However, when an LSI is mounted on an end of the display device by using COG method, the connecting terminals disposed on ends (LSI mounted area) of the active-matrix substrate 1, namely, the input/output terminals 14 act as input terminals and output terminals for the LSI.

FIG. 14 shows an example of the arrangement (package) in which the bonding part 13 is formed between the active-matrix substrate 1 and the TCP substrate 17, which is described as an external member in Embodiment 1.

In the above arrangement, upon making a connection (TCP connection) between the TCP substrate 17 and the input/output terminals 14 which are disposed on the active-matrix substrate 1, namely, upon forming the bonding part 13, for example, a photo-assist anisotropic conductive adhesive is used as an anisotropic conductive adhesive having photo-reactivity (photoreactive anisotropic conductive adhesive). In the present embodiment as well, the anisotropic conductive adhesive connects the TCP substrates 17 and the input/output terminals 14 by using its adhesion, and the adhesive electrically connects the input/output terminals 14 to the outside by using its anisotropic conductivity.

As the photo-assist thermosetting adhesive, for example, it is possible to adopt an adhesive in which irradiation of light activates a radical generating agent contained in the adhesive, and the generated radical assists polymerization reaction. When the photo-assist thermosetting anisotropic conductive adhesive is used, irradiation of light such as an ultraviolet ray and a visible ray generates, for example, a radical in the adhesive so as to improve activation; thus, the curing can be developed at a relatively low temperature.

As a specific method for connecting the active-matrix substrate 1 and the TCP substrate 17 in the above display device, it is possible to adopt the method described in Embodiment 1.

Firstly, an anisotropic conductive adhesive serving as the bonding part 13 is applied with an even thickness to the input/output terminals 14, which are formed on ends of the active-matrix substrate 1, by using a method such as screen process printing. Next, the connecting terminals (not shown) of the TCP substrates 17 are aligned with the input/output terminals 14 formed on ends of the active-matrix substrate 1; namely, the connecting part is determined. Finally, light such as an ultraviolet ray and a visible ray is emitted while pressurizing the connecting part between the connecting terminals of the TCP substrates 17 and the input/output terminals 14.

At least a part for bonding the input/output terminals 14 and the TCP substrates 17 has the property of transmitting light; thus, from the back of the surface on which the input/output terminals 14 of the active-matrix substrate 1 are disposed (formed), it is possible to positively supply enough amount of light to develop the photo-reactivity of the anisotropic conductive adhesive, via the input/output terminals 14, without being interrupted by the input/output terminals 14. With this arrangement, the anisotropic conductive adhesive can be efficiently connected. In this case, when the photo-assist thermosetting adhesive is used as the anisotropic conductive adhesive as described above, a heating operation is performed at a relatively low temperature, for example, at about 100° C. after irradiation of light or simultaneously with irradiation of light, so that the anisotropic conductive adhesive including the photo-curing resin is cured; hence, the bonding part 13 is formed.

As described above, the input/output terminals 14 of the active-matrix substrate 1 are connected with the connecting terminals of the TCP substrates 17 by using the photo-reactive anisotropic conductive adhesive as the bonding part 13, so that a heating operation at a high temperature is not necessary. Therefore, it is possible to lower a heating temperature for connecting the input/output terminals 14 to the outside so as to prevent degradation in positioning accuracy, that is caused by thermal expansion of the active-matrix substrate 1 and the connecting members, namely, the external members such as the TCP substrates 17. As a result, the connecting accuracy of the display device can be improved so as to realize higher definition of the display device.

Additionally, as a display device of the present invention, the present embodiment takes the liquid crystal display device using the above active-matrix substrate 1 as an example. However, the application of the active-matrix substrate 1 is not limited to the liquid crystal display device. For example, the active-matrix substrate 1 is applicable to a variety of display devices such as a display device formed by a combination of an organic EL (electroluminescence) material and an active-matrix substrate.

Further, as for the active-matrix substrate 1, the TFT 22 is used as a switching element (active element); however, the switching element is not limited to the TFT 22, so that a diode element, a plasma switching element, and the like are also available.

According to the above display device, it is possible to efficiently react (cure) the photo-assist anisotropic conductive adhesive so as to successively perform operations at low temperature in a short time. Therefore, it is surely possible to improve a throughput. Additionally, due to an operation at a low-temperature, it is possible to minimize a positional shift caused by a difference in thermal expansion coefficients of the active-matrix substrate 1 and the TCP substrates 17; therefore, the external members such as the TCP substrates 17 are effectively mounted (for example, TCP mounting) in the case of a display device having higher definition.

Moreover, when the display is liquid crystal, the display may become sensitive to heat depending upon the used liquid crystal materials and the alignment condition. Further, when the display is an organic EL, the materials themselves (organic EL) are organic, so that the display is relatively sensitive to heat in some cases. Therefore, as described above, when the display has low resistance to heat, the present invention is particularly effective.

Additionally, in Embodiment 4, the photo-assist anisotropic conductive adhesive is used when the input/output terminals 14 disposed (formed) on the active-matrix substrate 1 are electrically connected to the external circuit (external member) such as the TCP substrates 17. If the anisotropic conductive adhesive is a photoreactive anisotropic conductive adhesive, the adhesive is not limited to the photo-assist type. As mentioned above, it is possible to adopt an adhesive (photo-curing adhesive) which is cured by irradiation of light such as an ultraviolet ray and a visible ray.

Namely, in the present invention, the photoreactive anisotropic conductive adhesive is an adhesive (photo-curing adhesive) whose curing reaction is developed by irradiating light such as an ultraviolet ray and a visible ray, and an adhesive (photo-assist thermosetting adhesive) in which activation is improved by irradiating light such as an ultraviolet ray and a visible ray, and the curing is developed by performing a heating operation at a relatively low temperature.

In contrast, in Embodiments 1 through 3, when the input/output terminals 14 disposed (formed) on the active-matrix substrate 1 are electrically connected to the electric circuits (external member) such as the TCP substrates 17, the photo-curing anisotropic conductive adhesive is used. However, if the anisotropic conductive adhesive is a photoreactive anisotropic conductive adhesive, the adhesive is not limited to an adhesive (photo-curing adhesive) whose curing reaction is developed by irradiation of light such as an ultraviolet ray and a visible ray. Thus, it is possible to adopt an adhesive (photo-assist thermosetting adhesive) in which activation is improved by irradiating light such as an ultraviolet ray and a visible ray, and the curing is developed by performing a heating operation at a relatively low temperature.

As described above, when the photo-assist anisotropic conductive adhesive is used, activation is improved by, for example, a radical appearing in the adhesive due to irradiation of light such as an ultraviolet ray and a visible ray. Hence, after the irradiation of light or simultaneously with the irradiation of light, a heating operation is performed at a relatively low temperature, for example, around 100° C., or more preferably, a heating operation is performed at a temperature (60° C. to less than 80° C.), where the crystallization of the amorphous semiconductor layer can be reduced or prevented. Thus, the curing can be improved.

Therefore, for example, in Embodiments 1 through 3, when the photo-assist thermosetting anisotropic conductive adhesive is used as described in Embodiment 4, it is possible to achieve the same effect as Embodiments 1 through 3. In the same manner, for example, in Embodiment 4, when the photo-curing anisotropic conductive adhesive is used as described in Embodiments 1 through 3, it is possible to achieve the same effect as Embodiment 4.

As mentioned above, a two-dimensional image detector and a display device of the present invention are provided with an active-matrix substrate as an electrode substrate, on which electrode wires are formed in a lattice form and connecting terminals are provided for connecting the electrode wires to the outside, the electrode wires includes metal electrodes, and at least parts of the connecting terminals have the property of transmitting light and are connected to the outside via an anisotropic conductive adhesive having photo-reactivity. The connecting terminals are used as input/output terminals (mainly input terminals in a display device) for inputting and outputting an electronic signal to the electrode wires from the outside.

To be specific, the two dimensional image detector of the present invention, that can detect an electromagnetic wave image of an irradiation such as an X-ray, a visible ray and an infrared ray, includes (a) the active-matrix substrate which are provided with the electrode wires including metal electrodes and being disposed in a lattice form, a plurality of switching elements respectively disposed at intersections of the electrode wires, and the input/output terminals serving as connecting terminals to the outside to input and output an electronic signal from the outside to the electrode wires; and (b) an amorphous semiconductor layer with electromagnetic wave conductivity formed on the active-matrix substrate, wherein an electromagnetic wave image emitted to the amorphous semiconductor layer is detected in an image detecting section in response to a control signal inputted from the input/output terminals serving as input terminals, and an image signal corresponding to the electromagnetic wave image is outputted from the input/output terminals serving as output terminals, the input/output terminals partially having the property of transmitting light and being connected with the outside via an anisotropic conductive adhesive having photo-reactivity.

Further, the display device of the present invention includes (a) the active-matrix substrate which is provided with the electrode wires including the metal electrodes and being disposed in a lattice form, a plurality of the switching elements respectively disposed at the intersections of the electrode wires, and the input/output terminals for inputting or inputting/outputting an electronic signal from the outside to the electrode wires; and (b) an opposing substrate which is disposed so as to oppose the active-matrix substrate via an electro-optical medium such as liquid crystal, the input/output terminals partially having the property of transmitting light and being connected with the outside via an anisotropic conductive adhesive having photo-reactivity.

In this case, the two-dimensional image detector and the display device include a bonding part for electrically connecting the input/output terminals to the outside, and the bonding part is made of an anisotropic conductive adhesive having photo-reactivity.

According to the above arrangement, the electrode wires include the metal electrodes so as to maintain a resistance value within a fixed range. In addition, with the above arrangement, at least parts of the connecting terminals, which connect the electrode wires to the outside on the bonding part, have the property of transmitting light, so that it is possible to readily use the anisotropic conductive adhesive having photo-reactivity to connect the electrode wires to the outside. Further, the anisotropic conductive adhesive having photo-reactivity is used to connect the electrode wires to the outside so as to lower a heating temperature upon connecting the electrode wires.

Therefore, according to the above arrangement, it is not necessary to perform a heating operation at a high temperature upon connecting the electrode wires to the outside on a bonding part, so that for example, it is possible to prevent crystallization of the amorphous semiconductor layer from being developed during the heating operation.

Namely, for instance, when the amorphous semiconductor layer has selenium as a main component, a film (a-Se film) made of amorphous selenium is a unique material which has a very low crystallizing temperature of 60° C. to 80° C., normally, at 70° C., and crystallization is developed at this temperature or more. Therefore, with this arrangement, as the amorphous semiconductor layer of the two-dimensional image detector, it is possible to use an amorphous semiconductor layer, in which crystallization is developed by a heating operation even at a relatively low temperature of 60° C. to 80° C., for example, an a-Se film having selenium as a main component.

Therefore, with this arrangement, it is possible to prevent degradation of a characteristic such as a high dark resistance of the amorphous semiconductor layer. Further, according to this arrangement, the electrode wires include the metal electrodes so as to maintain a resistance value within a fixed range. Hence, with this arrangement, it is possible to favorably maintain sensitivity to detect an image.

Moreover, in the display device, it is possible to lower a heating temperature upon connecting the input/output terminals and the outside so as to prevent degradation of a positioning accuracy, that is caused by the substrates and the connecting members thermally expanded by heating. Thus, the arrangement makes it possible to improve connecting accuracy of the display device. Further, according to this arrangement, the electrode wires include the metal electrodes so as to maintain a resistance value within a fixed range. Therefore, this arrangement makes it possible to improve connecting accuracy of the display device while maintaining a resistance value within a fixed range, so that a display device with higher definition can be realized.

The connecting terminals for connecting the outside and the two-dimensional image detector and the display device can be, for example, made of a material having the property of transmitting light and can include metal terminal parts, and the connecting terminals can have openings penetrating the metal terminal parts in a thickness direction. With this arrangement, at least parts of the connecting terminals have the property of transmitting light.

According to this arrangement, upon connecting the connecting terminals to the external members such as an external electric circuit by using the anisotropic conductive adhesive having photo-reactivity, even when the connecting terminals are disposed between the bonding part and the active-matrix substrate, the connecting terminals can transmit, for example, enough amount of light to develop a reaction such as a photo-curing reaction caused by light (photo-reactivity) in the anisotropic conductive adhesive. Thus, for example, light can be sufficiently emitted to the anisotropic conductive adhesive from the back of the surface on which the input/output terminals are disposed (formed), in the active-matrix substrate. Therefore, this arrangement makes it possible to more positively connect the bonding part between the outside and the connecting terminals of the active-matrix substrate, namely, to more positively connect the external member and the two-dimensional image detector or the display device.

As described above, the active-matrix substrate of the present invention, that is used in the two-dimensional image detector and the display device, has a construction in which the electrode wires are formed in a lattice form, the connecting terminals are provided for connecting the electrode wires to the outside, the electrode wires include the metal electrodes, and at least parts of the connecting terminals have the property of transmitting light.

To be specific, the active-matrix substrate of the present invention is provided with the electrode wires disposed in a lattice form, a plurality of the switching elements disposed respectively at the intersections of the electrode wires, and the input/output terminals for inputting and outputting an electronic signal from the outside to the electrode wires, wherein the electrode wires are formed by metal electrodes, plate-shaped electrodes, which are made of a material selected from ITO, $SnO_2$, and ZnO with the property of transmitting light such as a visible ray and an ultraviolet ray, are used only for the input/output terminals disposed on ends of the electrode wires, and the openings penetrating the input/output terminals in a thickness direction are disposed so as to transmit light to the input/output terminals in a sufficient amount to develop a reaction caused by light (photo-reactivity) in the anisotropic conductive adhesive; thus, it is possible to achieve enough transparency to a visible ray and an ultraviolet ray and to maintain a resistance value of the electrode wires.

Here, the electrode wires and the input/output terminals can have a laminated structure in which a part made of a metal part (metal electrode) and a transparent conductive) oxide film (transparent electrode) are stacked.

Furthermore, as described above, the connecting terminals can be made of a material having the property of transmitting light, include the metal terminal parts, and can be provided with the openings penetrating the metal terminal parts in a thickness direction.

With the above active-matrix substrate, at least parts of the connecting terminals have the property of transmitting light, so that when the connecting terminals are connected to the outside, for example, to the external member such as an external electric circuit by using the anisotropic conductive adhesive having photo-reactivity, in TCO method and COG method, it is possible to readily use the anisotropic conductive adhesive having photo-reactivity as an adhesive for connecting the connecting terminals to the outside, and even when the input/output terminals are disposed between the bonding part and the active-matrix substrate, it is possible to sufficiently emit light to the anisotropic conductive adhesive from the back of the surface on which the input/output terminals are disposed (formed), in the active-matrix substrate. Hence, with this arrangement, the electrode wires include the metal wires so as to maintain a resistance value within a fixed range and to positively connect the bonding part to the outside at a low temperature.

Therefore, the above active-matrix substrate is suitable for the two-dimensional image detector and the display device, and the active-matrix substrate is used for the substrate parts thereof so as to prevent degradation in a characteristic of the amorphous semiconductor layer and to prevent degradation in positioning accuracy, that is caused by thermal expansion of the connecting members, while maintaining a resistance value at a fixed value. Consequently, the active-matrix substrate is used so as to favorably maintain sensitivity to detect an image in the two-dimensional image detector, and higher definition can be realized in the display device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An active matrix substrate comprising:

electrode wires made of metal disposed in a lattice form, a plurality of switching elements in communication with said metal electrode wires, connecting terminals for connecting said metal electrode wires to an outside, wherein at least parts of said connecting terminals have a property of transmitting light, and wherein said metal electrode wires are substantially non-light-transmitting; and wherein at least one of said connecting terminals includes a non-transmissive portion for shielding or blocking light, and said non-transmissive portion comprises a structure in which a transparent conductive film is stacked on a metallic film.

2. The active-matrix substrate as defined in claim 1, wherein said connecting terminal is made of a material having a property of transmitting light.

3. An active matrix substrate comprising:

electrode wires made of metal disposed in a lattice form, a plurality of switching elements in communication with said metal electrode wires, connecting terminals for connecting said metal electrode wires to an outside, wherein at least parts of said connecting terminals have a property of transmitting light, and wherein said metal electrode wires are substantially non-light-transmitting; and wherein at least one of said connecting terminals includes a metal terminal pail and openings penetrating the metal terminal part in a thickness direction.

4. The active-matrix substrate as defined in claim 3, wherein a metal part of said metal terminal part has a width between 2 $\mu$m and 50 $\mu$m.

5. A The active-matrix substrate as defined in claim 3, wherein said openings are formed in a lattice form.

6. The active-matrix substrate as defined in claim 3, wherein said connecting terminal has a laminated structure consisting of a metal and a transparent conductive oxide film.

* * * * *